United States Patent
Ootsuka

(10) Patent No.: US 12,085,842 B2
(45) Date of Patent: Sep. 10, 2024

(54) IMAGING DEVICE AND ELECTRONIC APPARATUS FOR FLARE REDUCTION IN AN ON-CHIP LENS ARRAY

(71) Applicant: SONY SEMICONDUCTOR SOLUTIONS CORPORATION, Kanagawa (JP)

(72) Inventor: Yoichi Ootsuka, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 437 days.

(21) Appl. No.: 17/421,463

(22) PCT Filed: Jan. 9, 2020

(86) PCT No.: PCT/JP2020/000457
§ 371 (c)(1),
(2) Date: Jul. 8, 2021

(87) PCT Pub. No.: WO2020/149207
PCT Pub. Date: Jul. 23, 2020

(65) Prior Publication Data
US 2022/0066309 A1    Mar. 3, 2022

(30) Foreign Application Priority Data
Jan. 17, 2019    (JP) .................. 2019-006276

(51) Int. Cl.
*G03B 30/00*    (2021.01)
*G02B 3/00*    (2006.01)
(Continued)

(52) U.S. Cl.
CPC .......... *G03B 30/00* (2021.01); *G02B 3/0056* (2013.01); *G02B 5/201* (2013.01); *H04N 5/33* (2013.01)

(58) Field of Classification Search
CPC .......... G03B 30/00; G02B 5/201; H04N 5/33
See application file for complete search history.

(56) References Cited

U.S. PATENT DOCUMENTS

2005/0024519 A1    2/2005    Nishida et al.
2014/0320968 A1*   10/2014   Murata ............ B29D 11/00317
                                                          359/601
(Continued)

FOREIGN PATENT DOCUMENTS

CN    1581501 A      2/2005
CN    105900238 A    8/2016
(Continued)

OTHER PUBLICATIONS

Park, et al. "Back-Illuminated Ultraviolet Image Sensor in Silicon-on-Sapphire." 2008 IEEE International Symposium on Circuits and Systems. May 18-21, 2008. (Year: 2008).*
(Continued)

*Primary Examiner* — Kyle M Lotfi
(74) *Attorney, Agent, or Firm* — CHIP LAW GROUP

(57) ABSTRACT

Provided is an imaging device including a light reception section that includes a plurality of pixels each performing photoelectric conversion and a plurality of on-chip lenses that is provided on a light incident side of the light reception section at a pitch less than a length of a wavelength on a longest wavelength side of a wavelength region of light to be received by the light reception section. The imaging device further includes a transparent substrate that is provided on a light incident side of the on-chip lenses.

19 Claims, 33 Drawing Sheets

(51) Int. Cl.
  *G02B 5/20* (2006.01)
  *H04N 5/33* (2023.01)

(56) References Cited

U.S. PATENT DOCUMENTS

| | | | |
|---|---|---|---|
| 2015/0097157 A1 | 4/2015 | Onakido | |
| 2015/0381907 A1* | 12/2015 | Boettiger | H01L 27/14621 |
| | | | 348/164 |
| 2016/0104734 A1 | 4/2016 | Hirose et al. | |
| 2016/0133762 A1 | 5/2016 | Caret | |
| 2016/0355709 A1 | 12/2016 | Katou et al. | |
| 2017/0287962 A1 | 10/2017 | Ootsuka | |
| 2019/0165021 A1 | 5/2019 | Ono et al. | |

FOREIGN PATENT DOCUMENTS

| | | | | |
|---|---|---|---|---|
| CN | 105934478 A | 9/2016 | | |
| CN | 106796942 A | 5/2017 | | |
| CN | 109196848 A | 1/2019 | | |
| CN | 110431453 A | 11/2019 | | |
| EP | 1503420 A1 | 2/2005 | | |
| EP | 3007228 A1 | 4/2016 | | |
| JP | 09-229763 A | 9/1997 | | |
| JP | 2000-068491 A | 3/2000 | | |
| JP | 2005-056999 A | 3/2005 | | |
| JP | 2008-066669 A | 3/2008 | | |
| JP | 2010-186818 A | 8/2010 | | |
| JP | 2013-143431 A | 7/2013 | | |
| JP | 2015-073029 A | 4/2015 | | |
| JP | 2015167219 A | * 9/2015 | | G02B 19/0014 |
| JP | 2016-122732 A | 7/2016 | | |
| JP | 2016-526294 A | 9/2016 | | |
| JP | 2016-197704 A | 11/2016 | | |
| JP | 2017-146527 A | 8/2017 | | |
| JP | 2018-064007 A | 4/2018 | | |
| JP | 2018-200423 A | 12/2018 | | |
| KR | 10-2005-0016021 A | 2/2005 | | |
| KR | 10-2016-0113584 A | 9/2016 | | |
| KR | 10-2017-0072889 A | 6/2017 | | |
| TW | 201538655 A | 10/2015 | | |
| TW | 201902206 A | 1/2019 | | |
| WO | 2014/188018 A1 | 11/2014 | | |
| WO | 2015/122300 A1 | 8/2015 | | |
| WO | 2015115537 A1 | 8/2015 | | |
| WO | 2016/052249 A1 | 4/2016 | | |
| WO | 2016/055909 A1 | 4/2016 | | |
| WO | 2017/200007 A1 | 11/2017 | | |
| WO | 2018/070259 A1 | 4/2018 | | |
| WO | 2018/221191 A1 | 12/2018 | | |

OTHER PUBLICATIONS

International Search Report and Written Opinion of PCT Application No. PCT/JP2020/000457, issued on Mar. 17, 2020, 14 pages of ISRWO.

* cited by examiner

[FIG. 1]
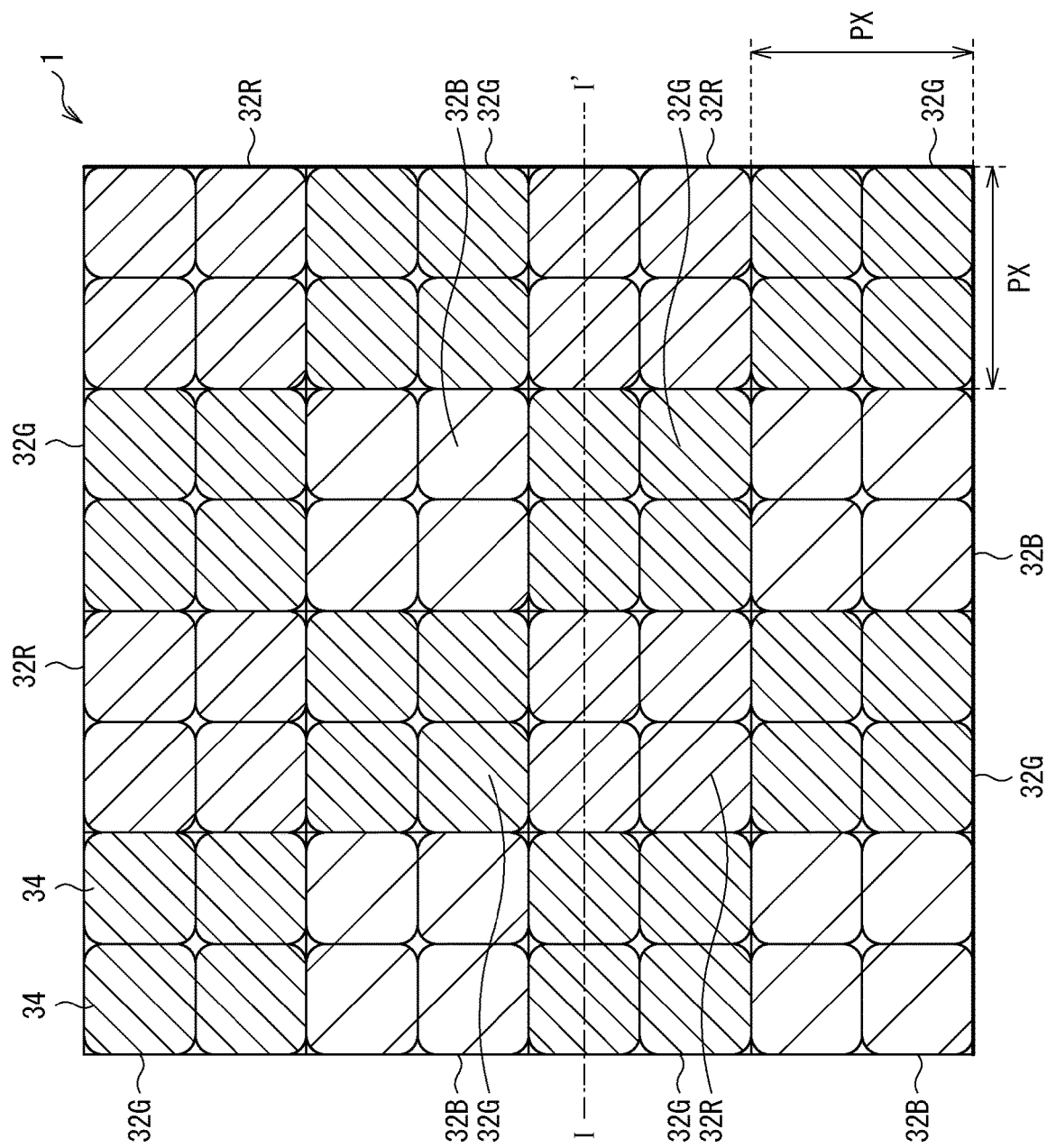

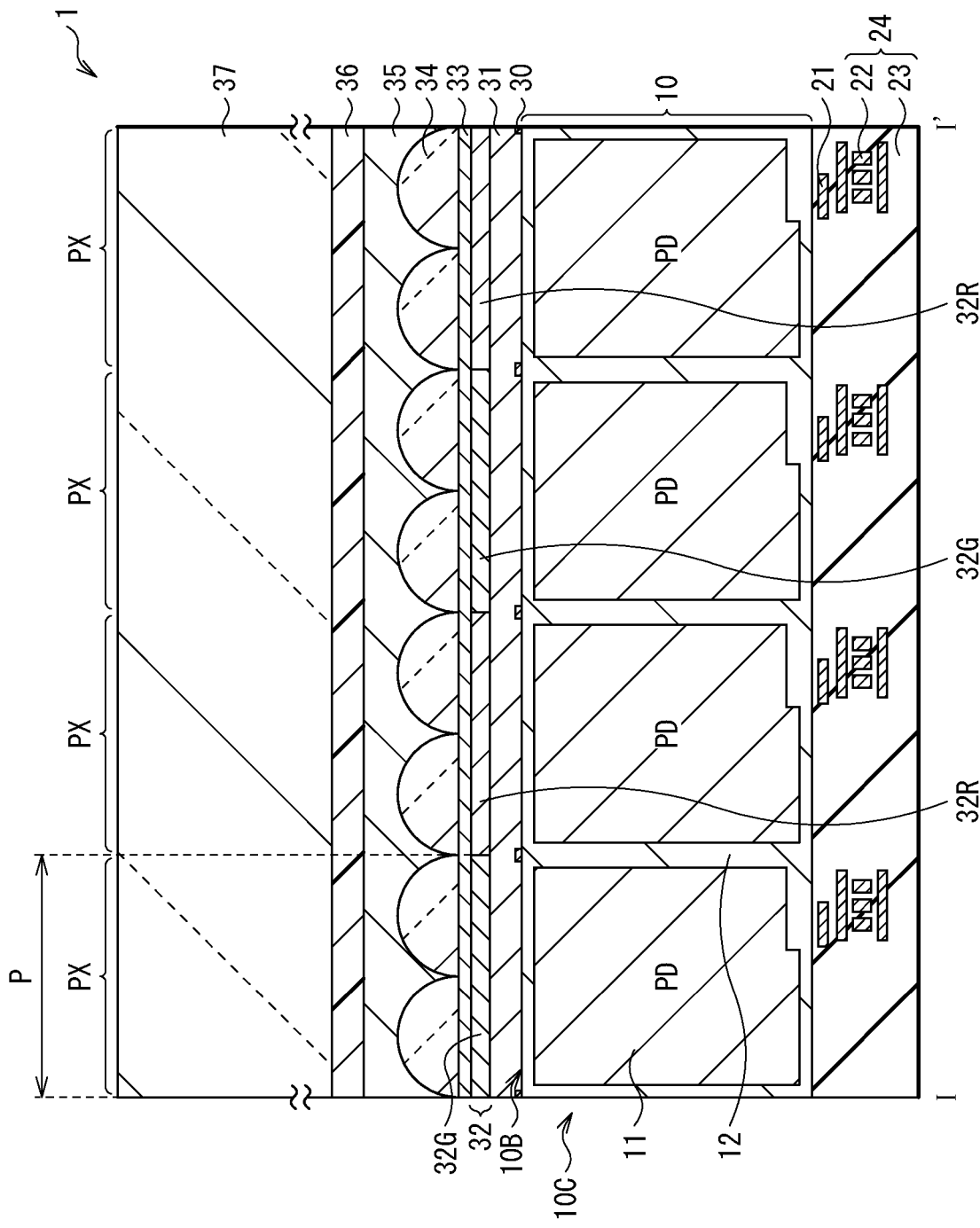

[FIG. 3A]
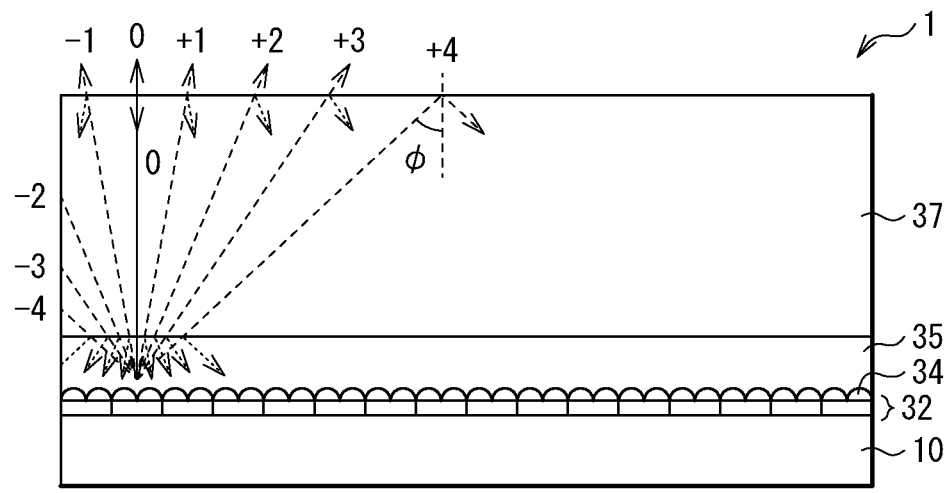
[FIG. 3B]
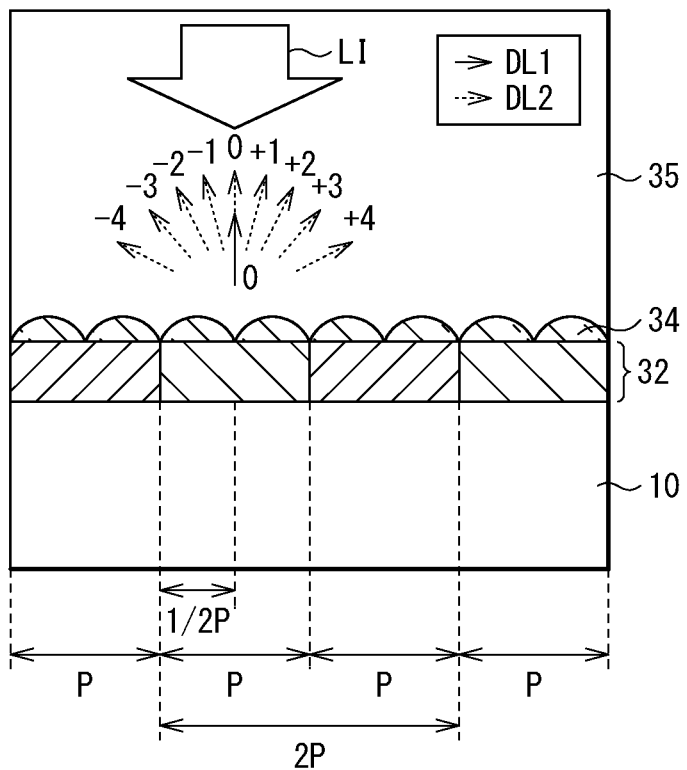

[FIG. 4]
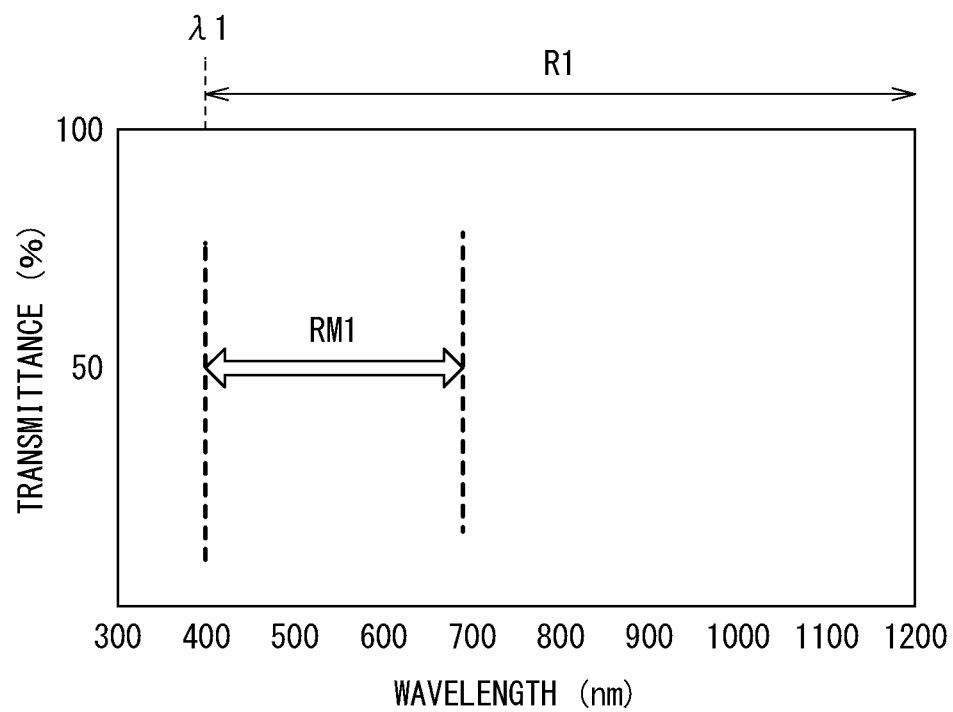

[FIG. 5A]
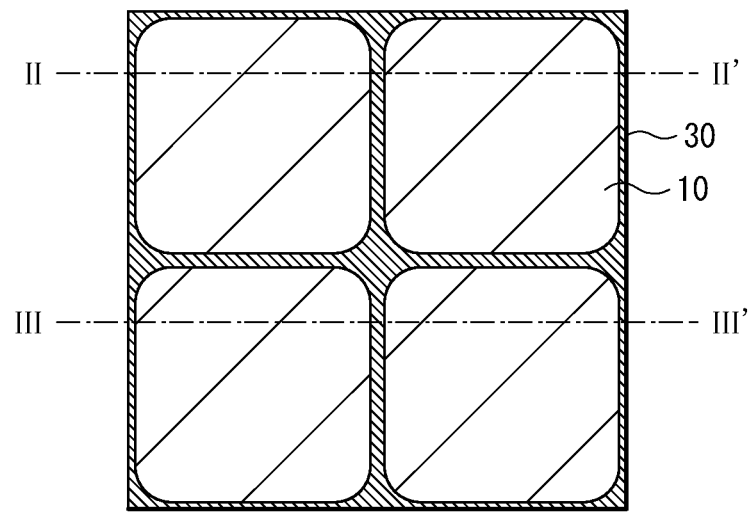
[FIG. 5B]
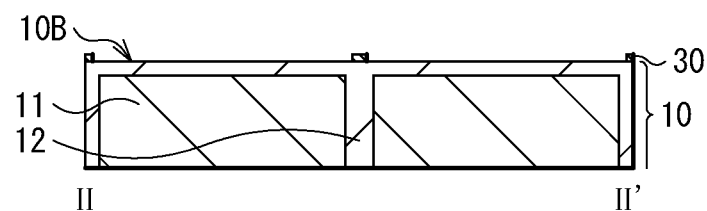
[FIG. 5C]
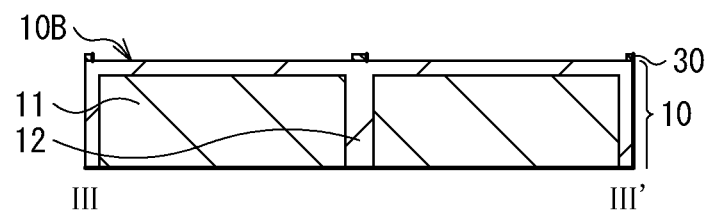

[FIG. 6A]
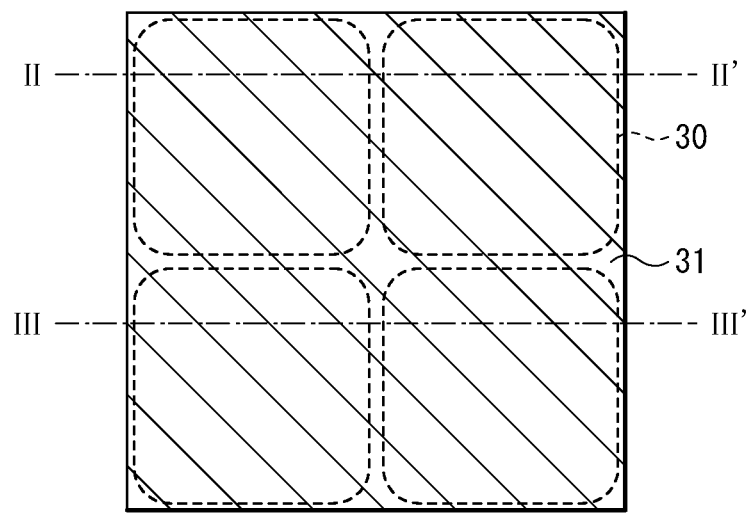
[FIG. 6B]
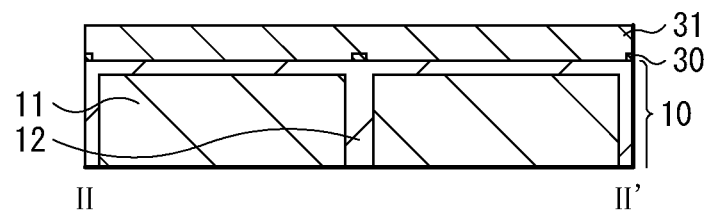
[FIG. 6C]
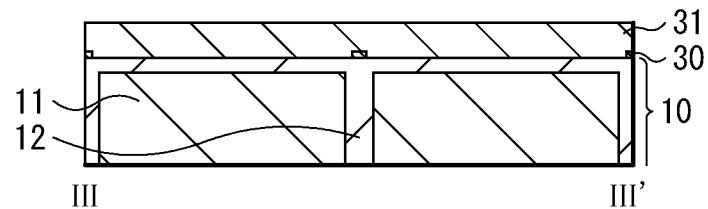

[FIG. 7A]
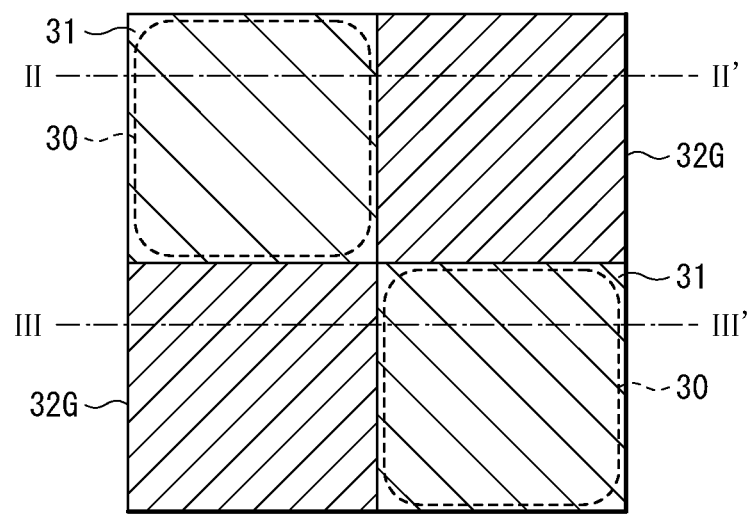
[FIG. 7B]
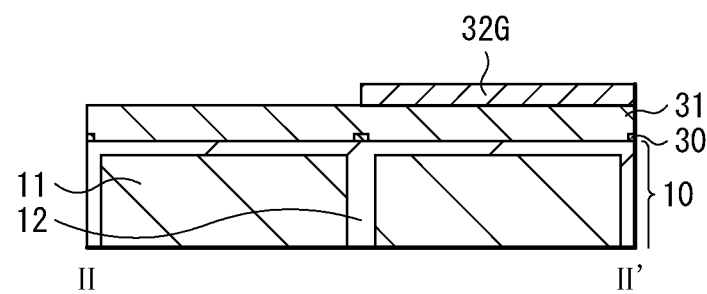
[FIG. 7C]
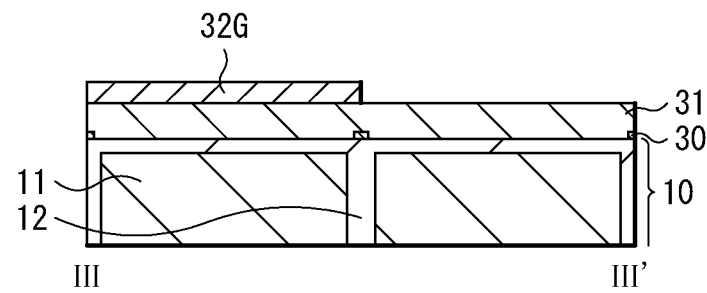

[FIG. 8A]
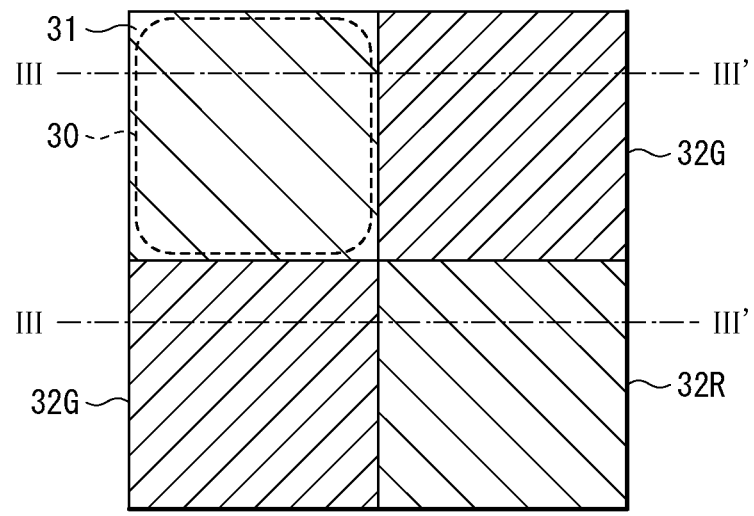
[FIG. 8B]
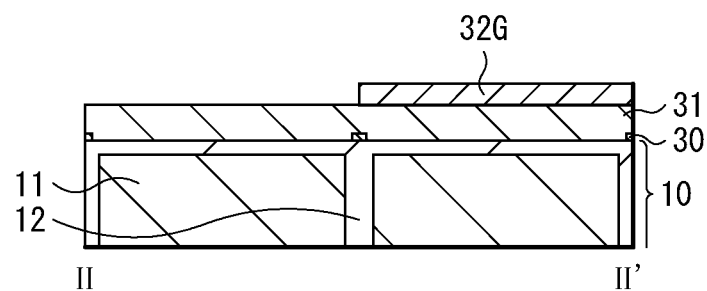
[FIG. 8C]
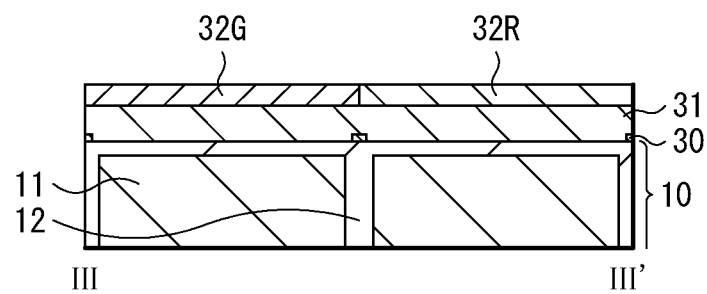

[FIG. 9A]
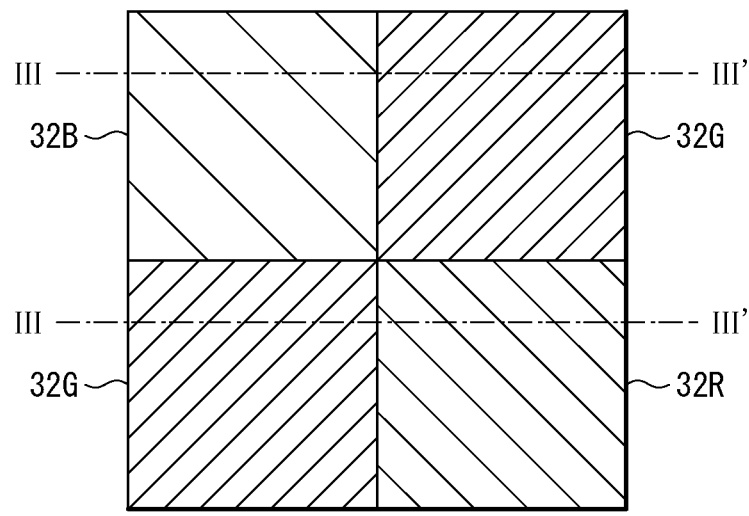
[FIG. 9B]
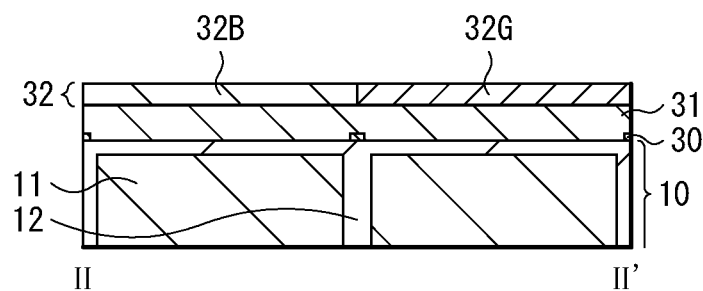
[FIG. 9C]
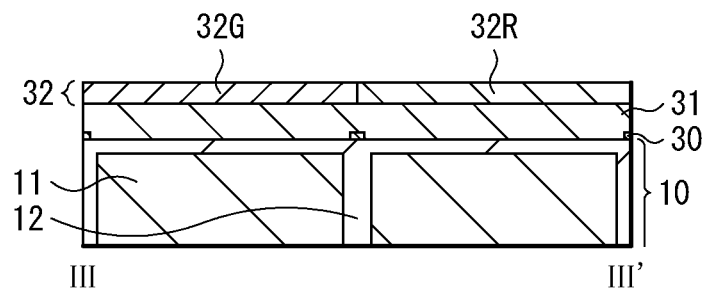

[FIG. 10A]
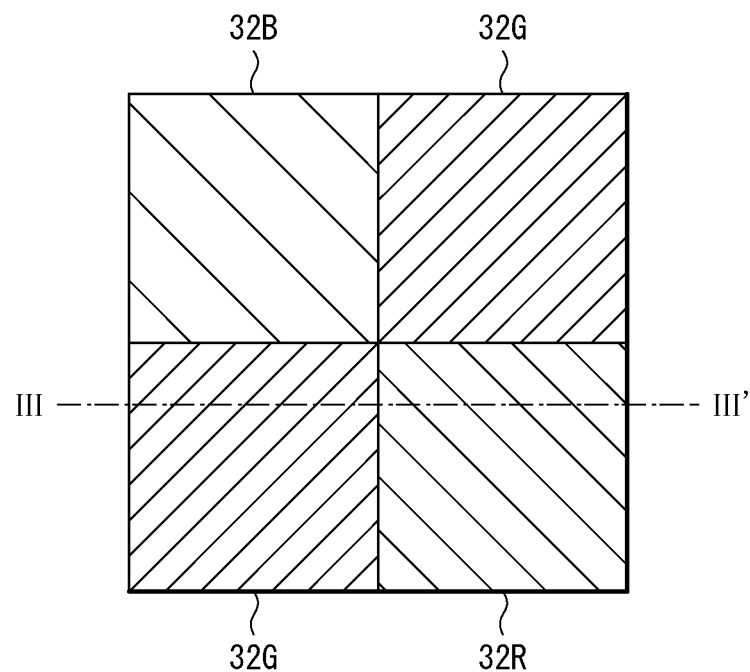
[FIG. 10B]
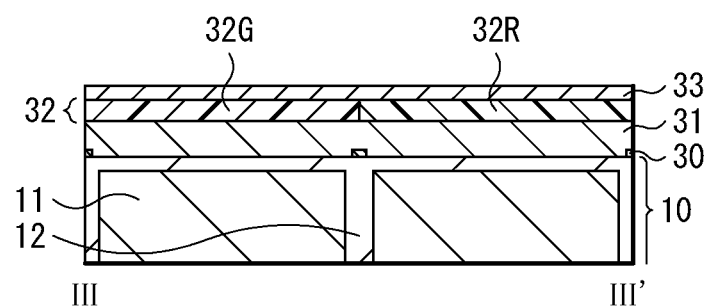

[FIG. 11A]
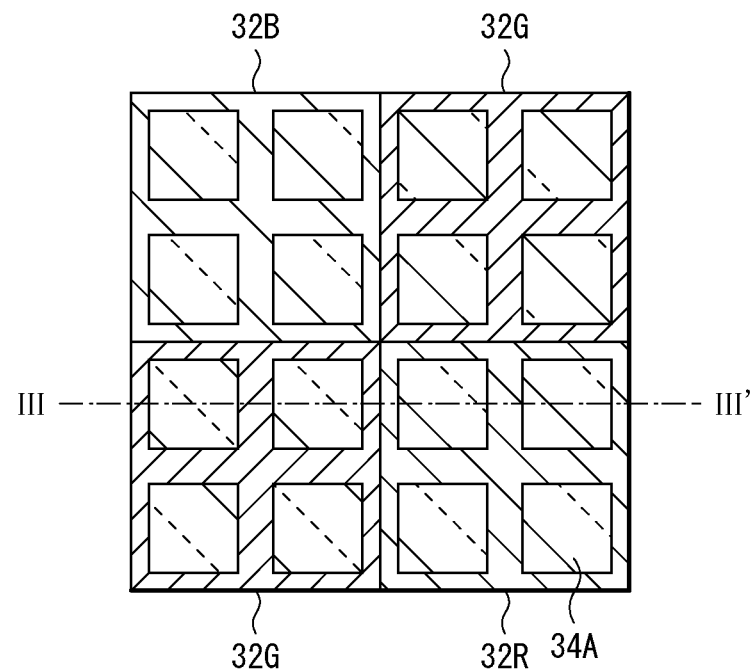
[FIG. 11B]
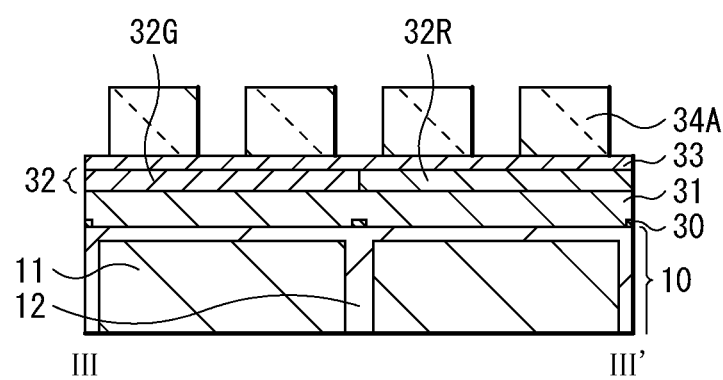

[FIG. 12A]
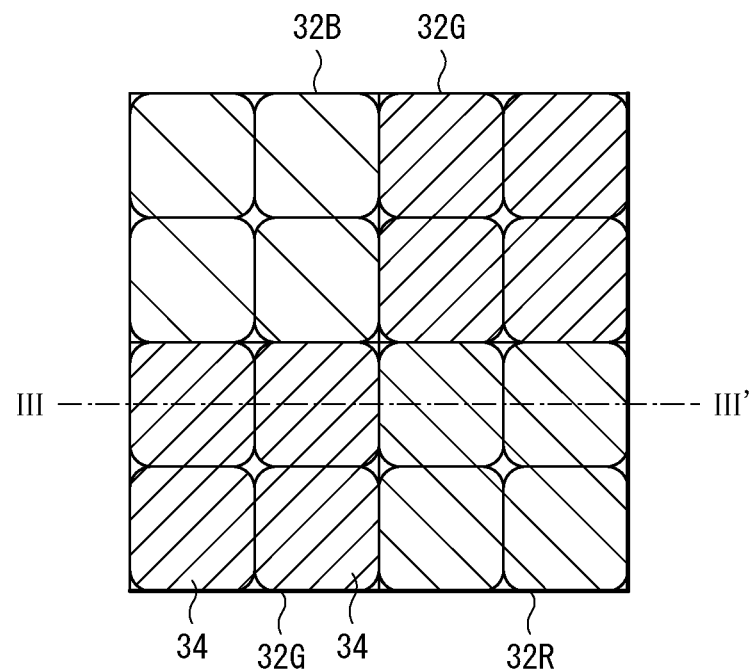
[FIG. 12B]
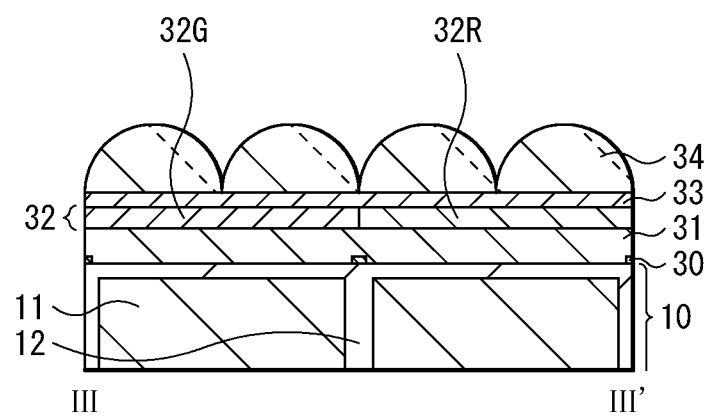

[FIG. 13A]
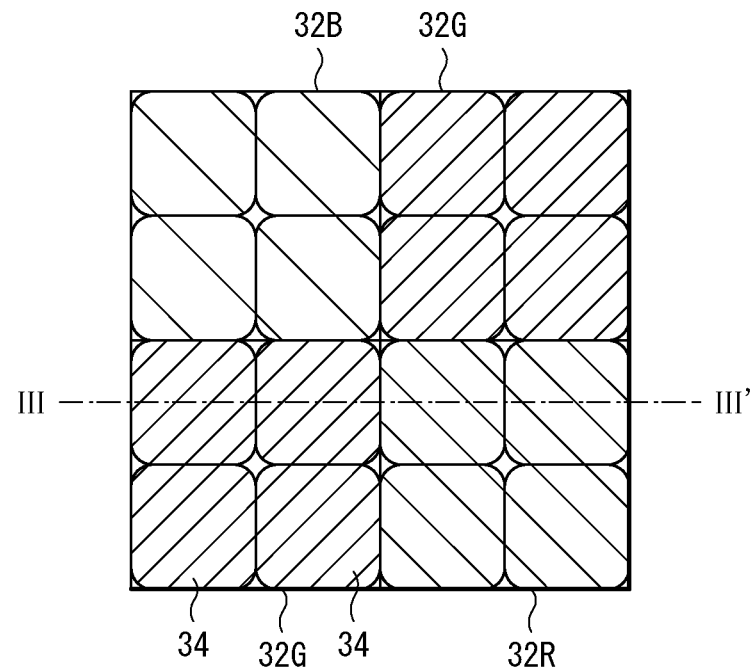
[FIG. 13B]
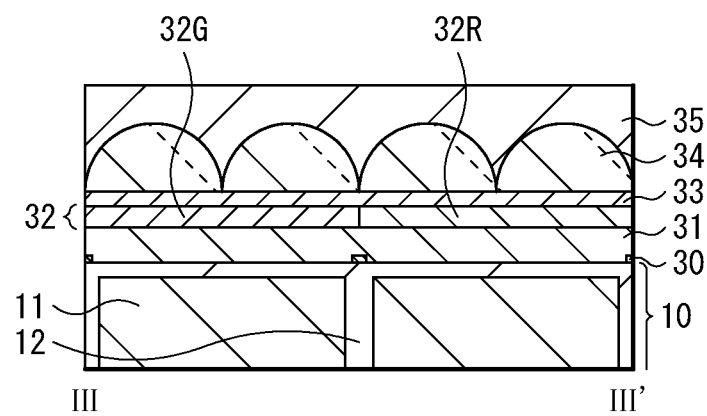

[FIG. 14A]
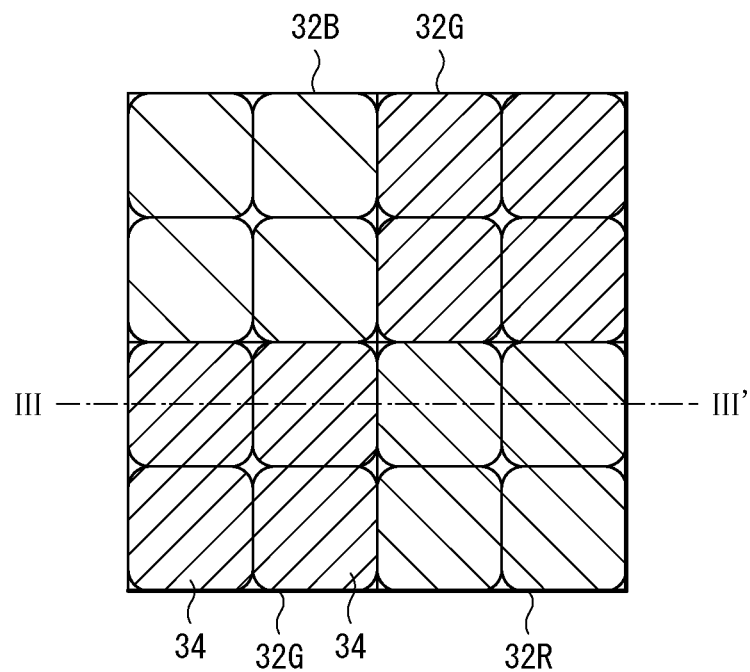
[FIG. 14B]
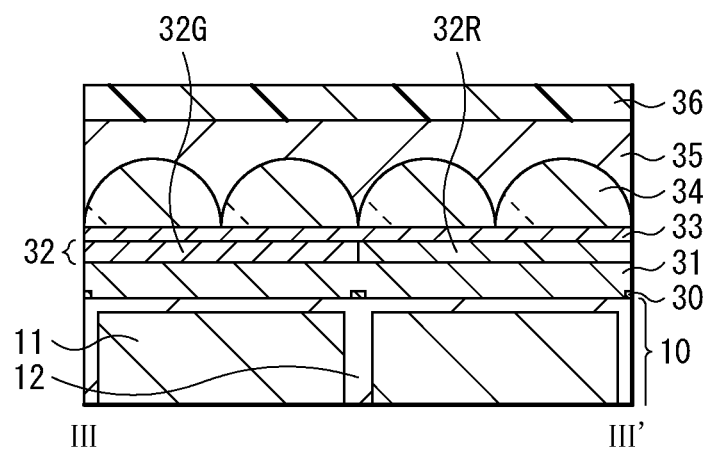

[FIG. 15A]
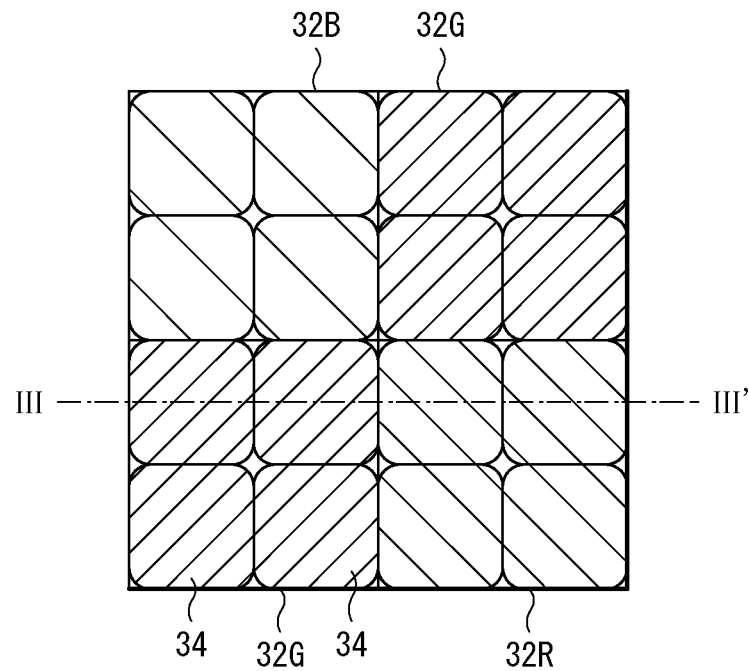
[FIG. 15B]
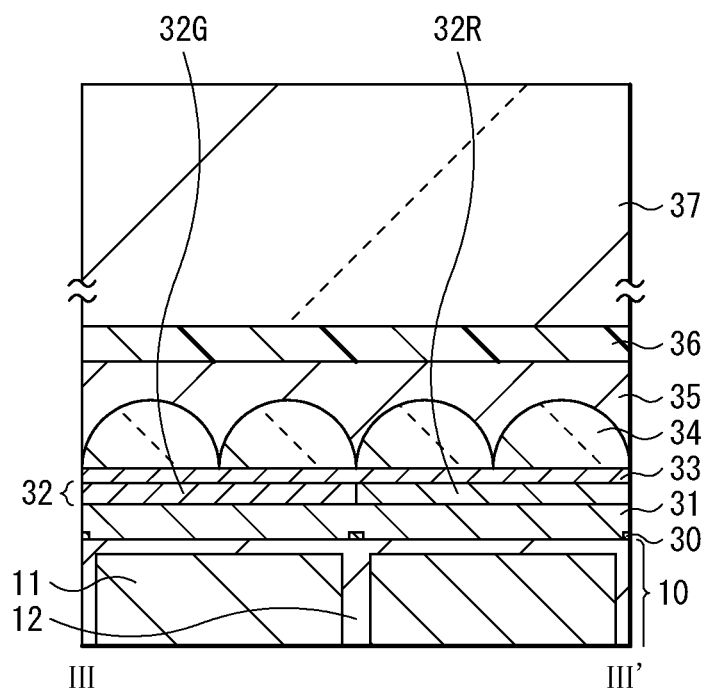

[FIG. 16]
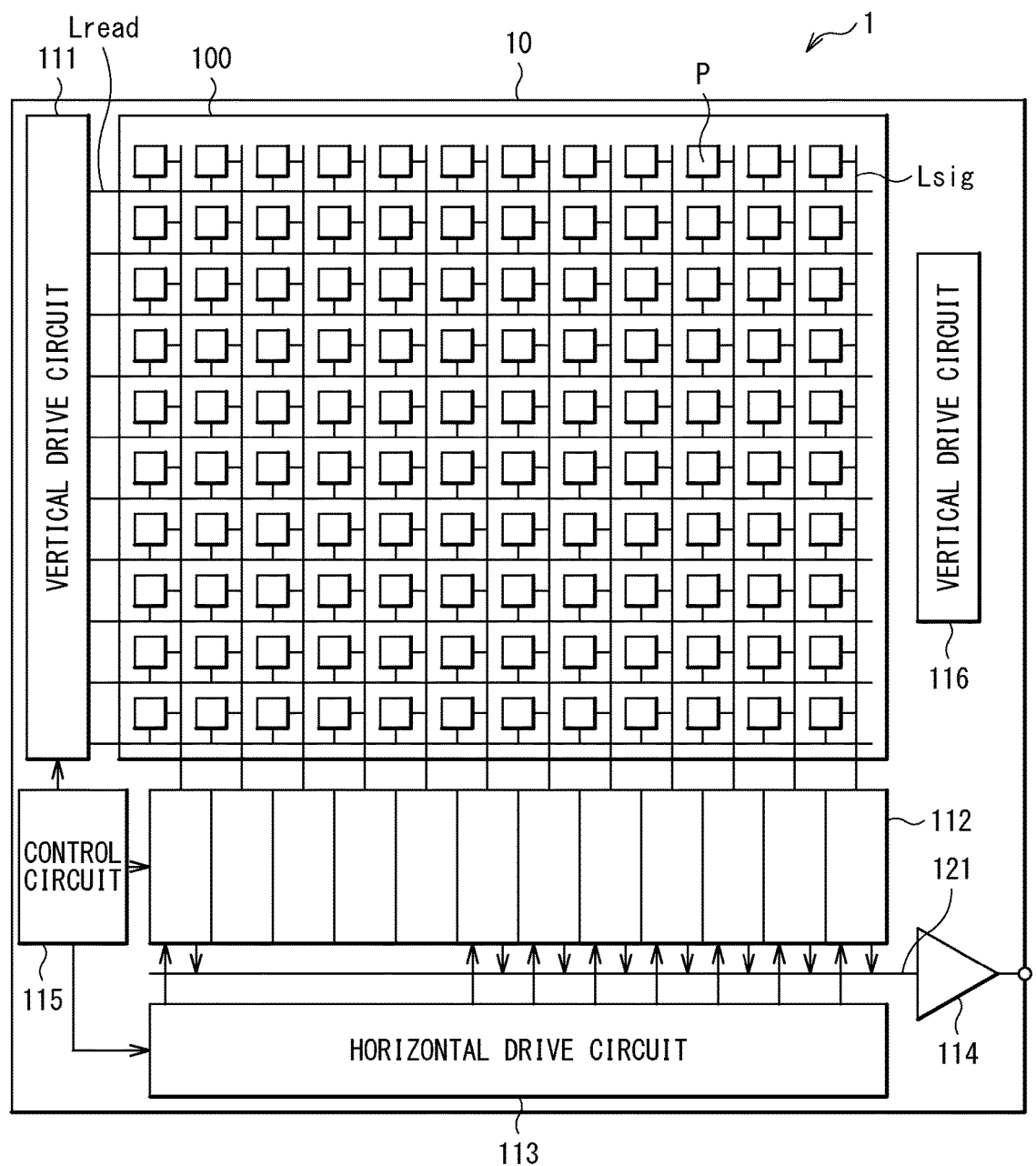

[FIG. 17A]
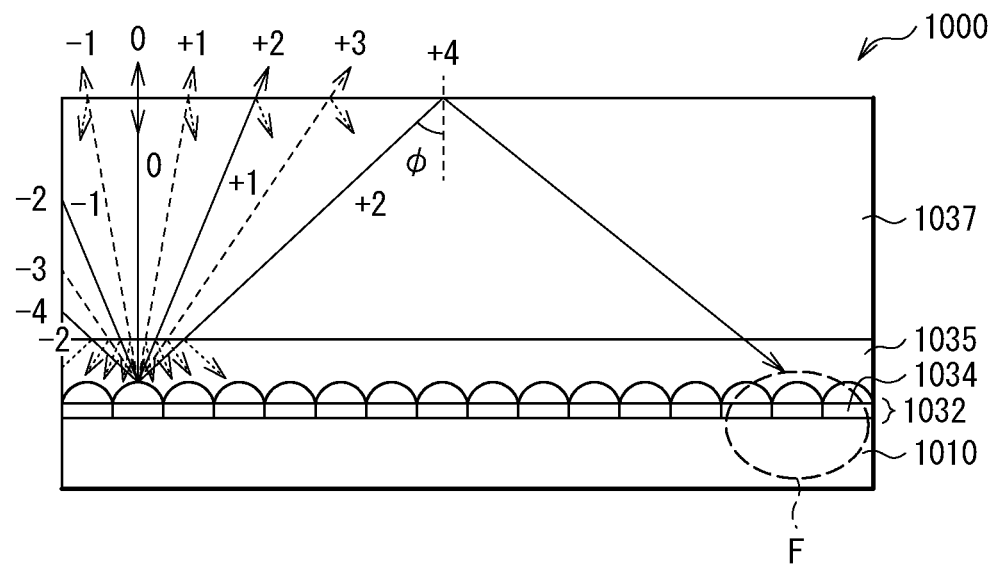
[FIG. 17B]
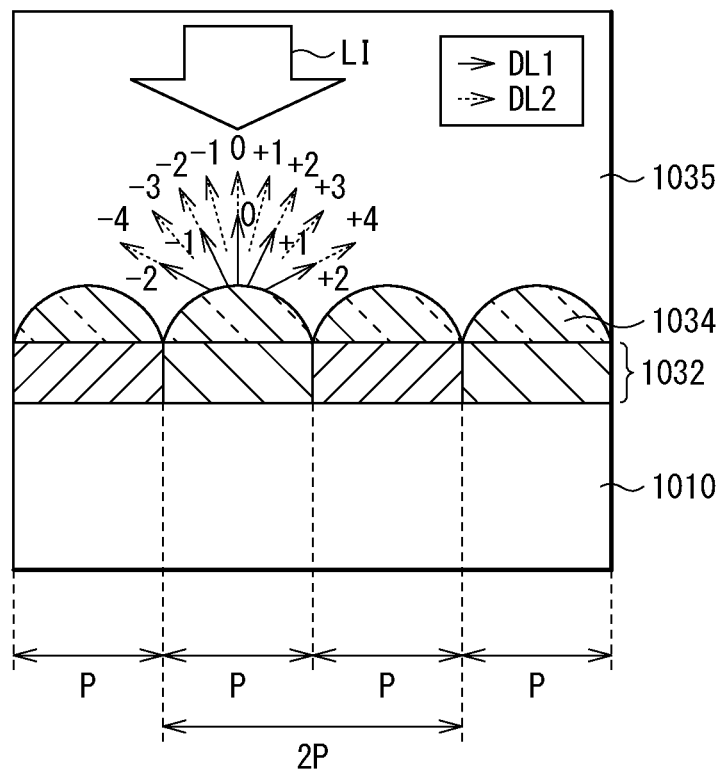

[FIG. 18A]
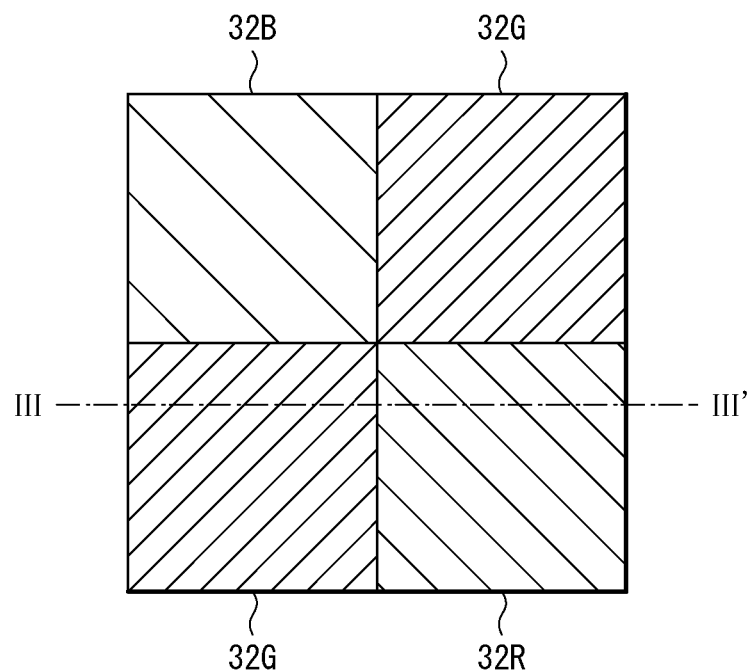
[FIG. 18B]
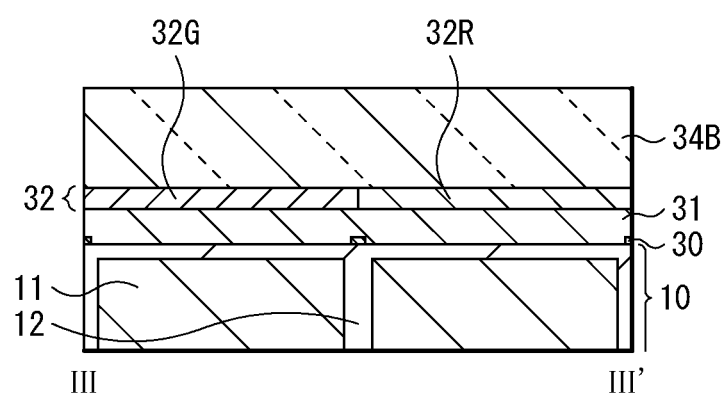

[FIG. 19A]
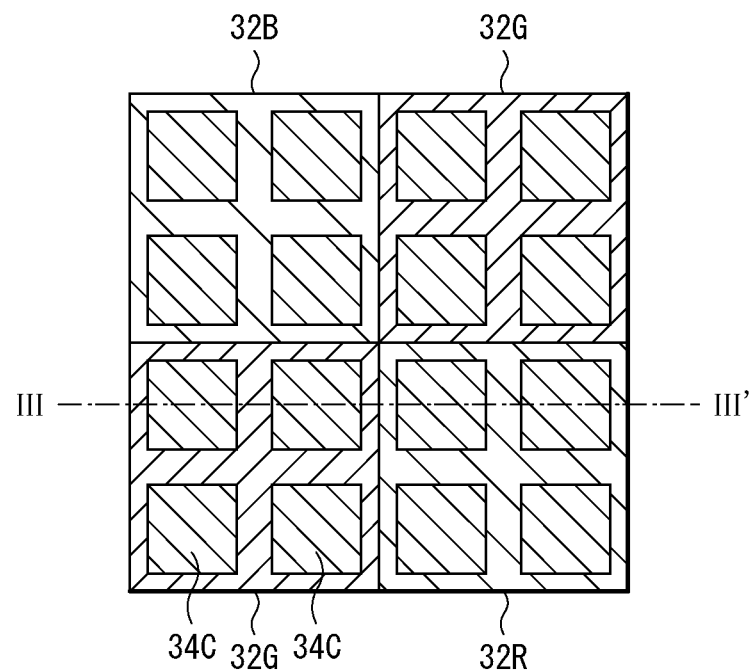
[FIG. 19B]
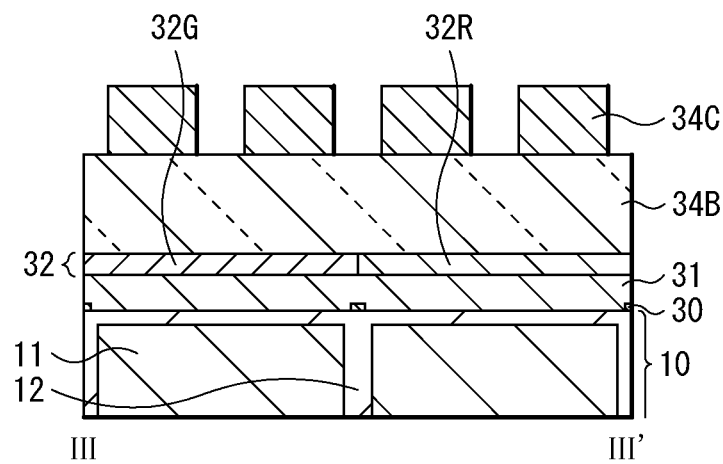

[FIG. 20A]
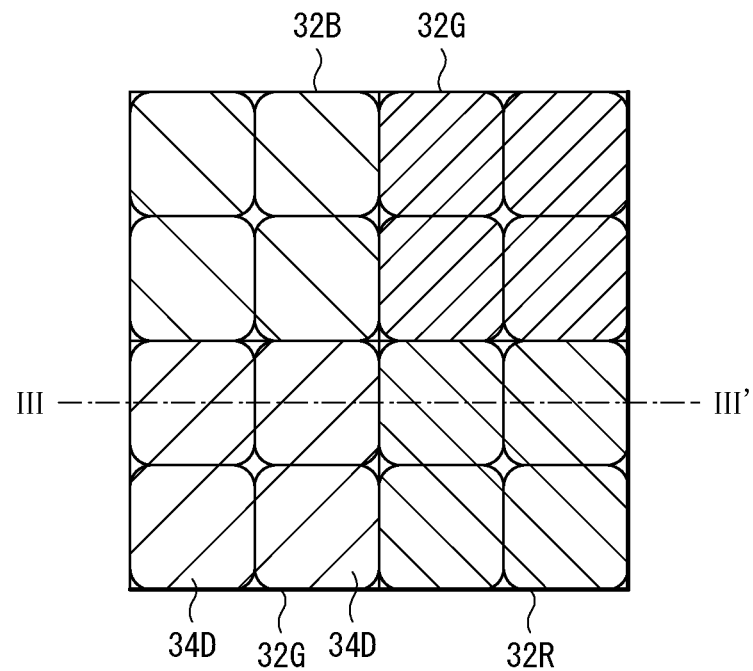
[FIG. 20B]
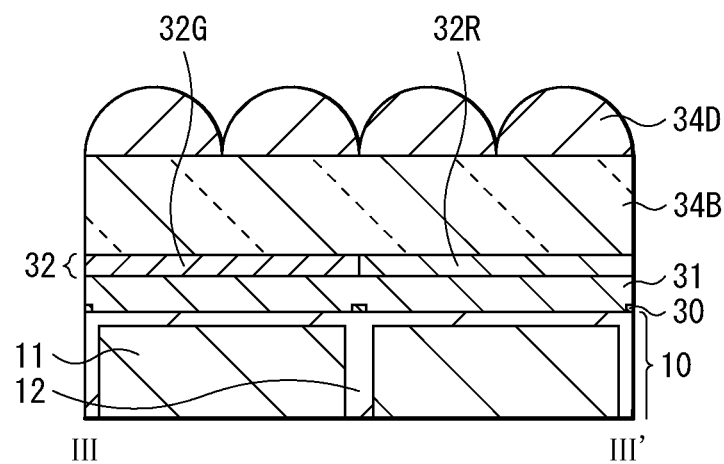

[FIG. 21A]
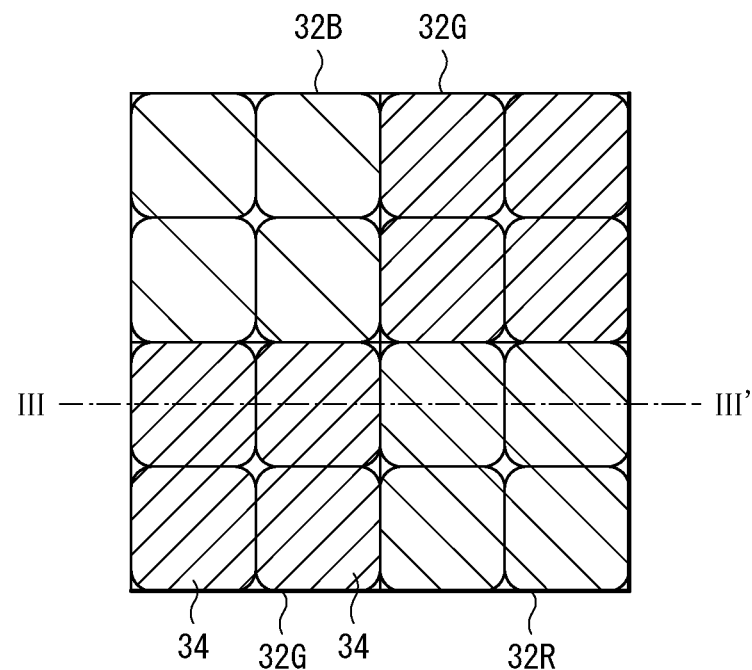
[FIG. 21B]
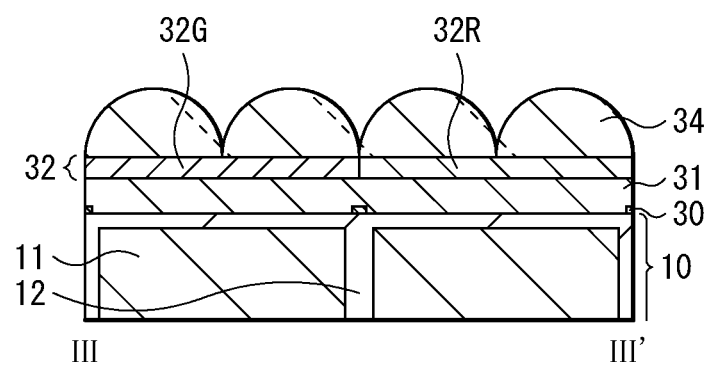

[FIG. 22A]
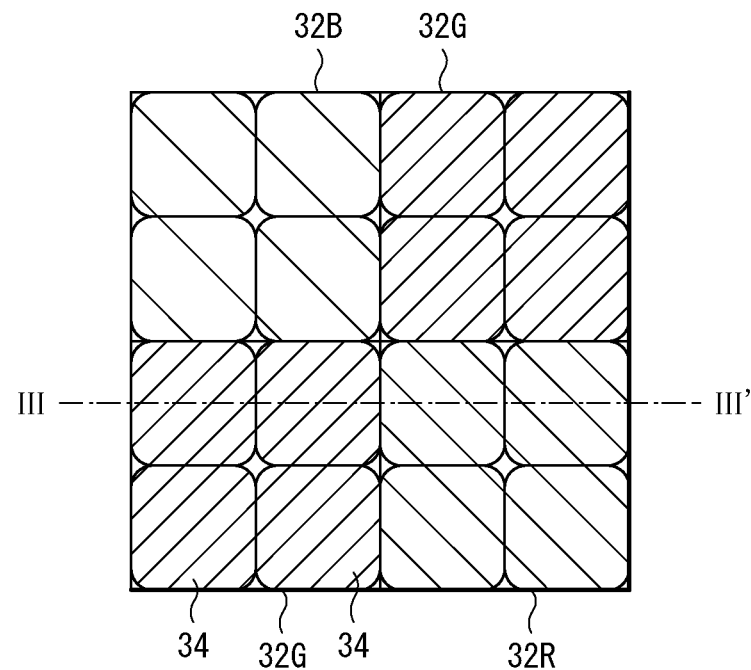
[FIG. 22B]
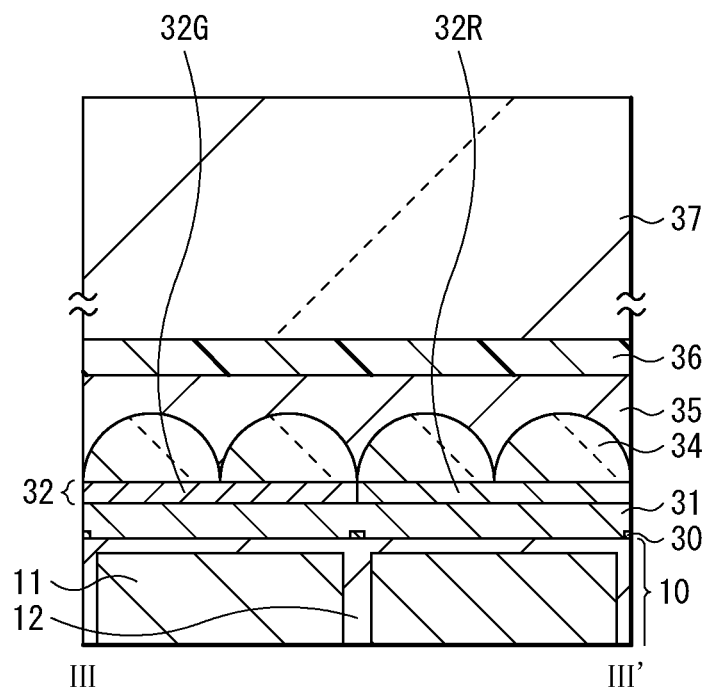

[FIG. 23]
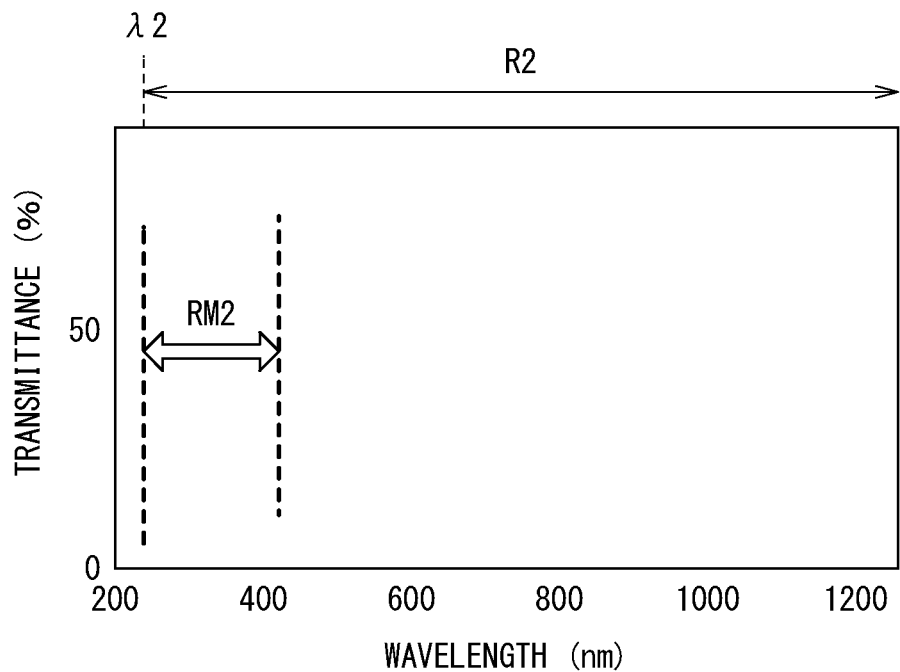
[FIG. 24]
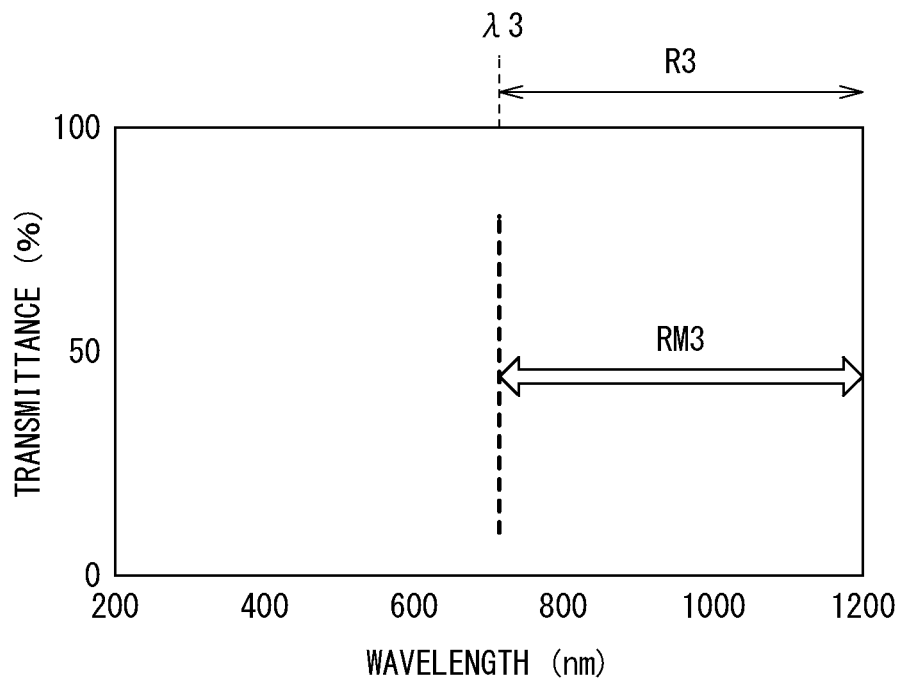

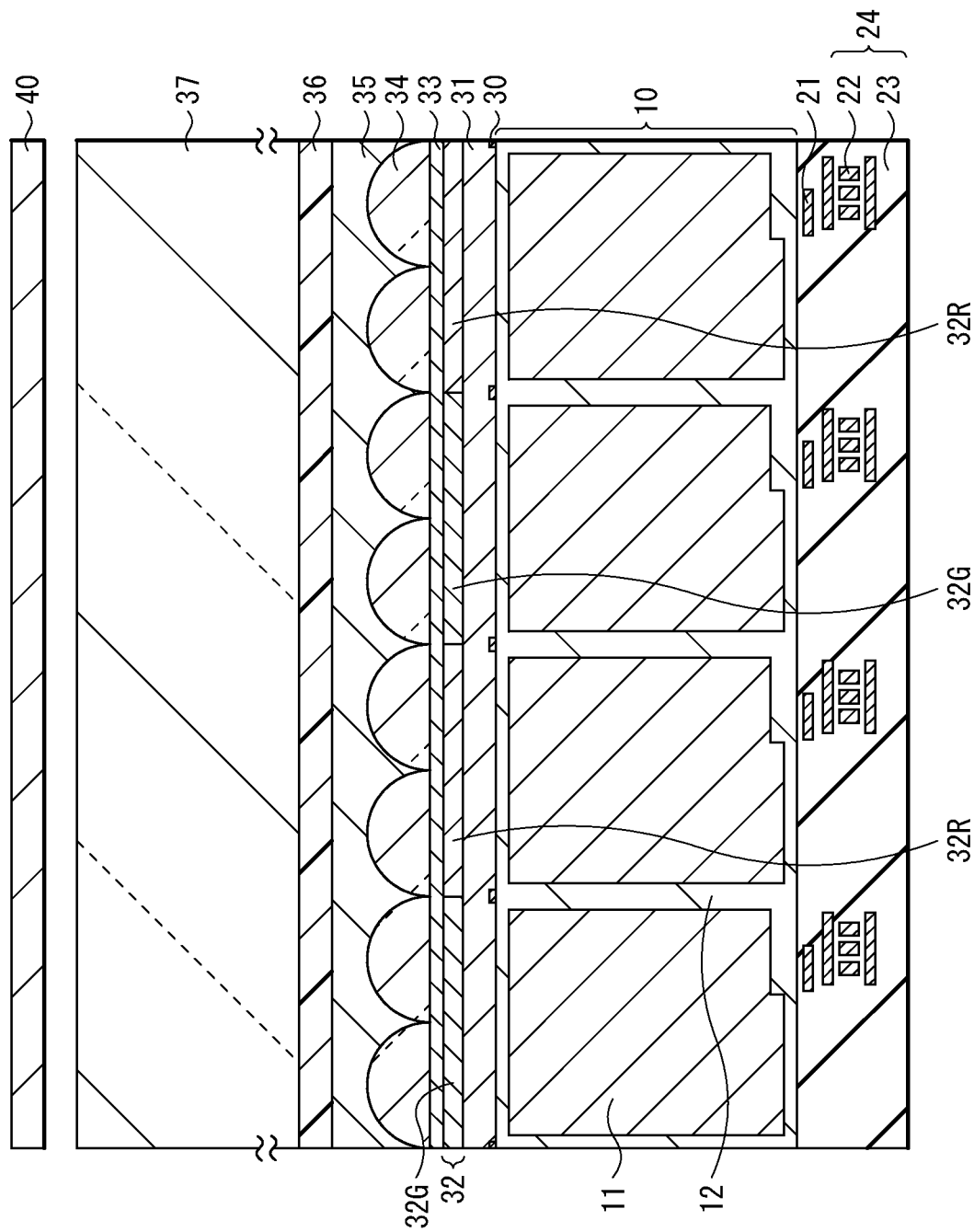
[FIG. 25]

[FIG. 26]
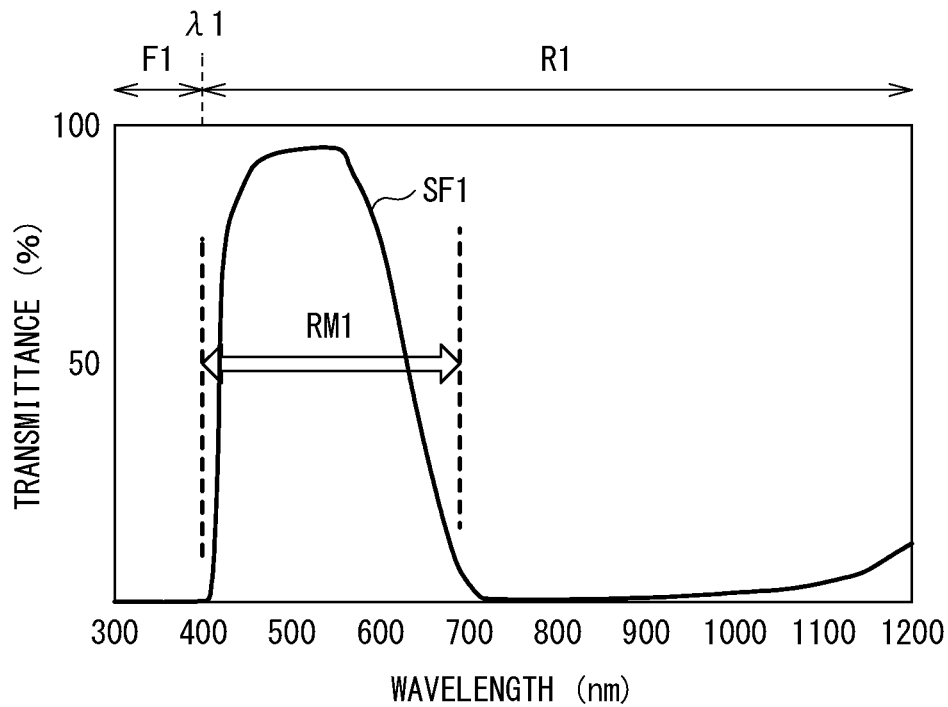
[FIG. 27]
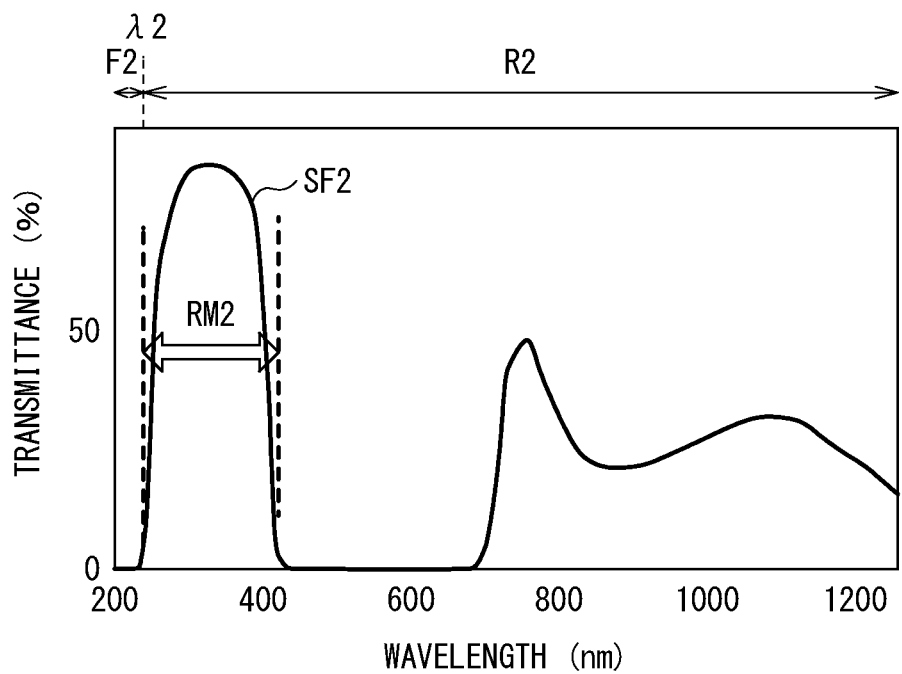

[FIG. 28]
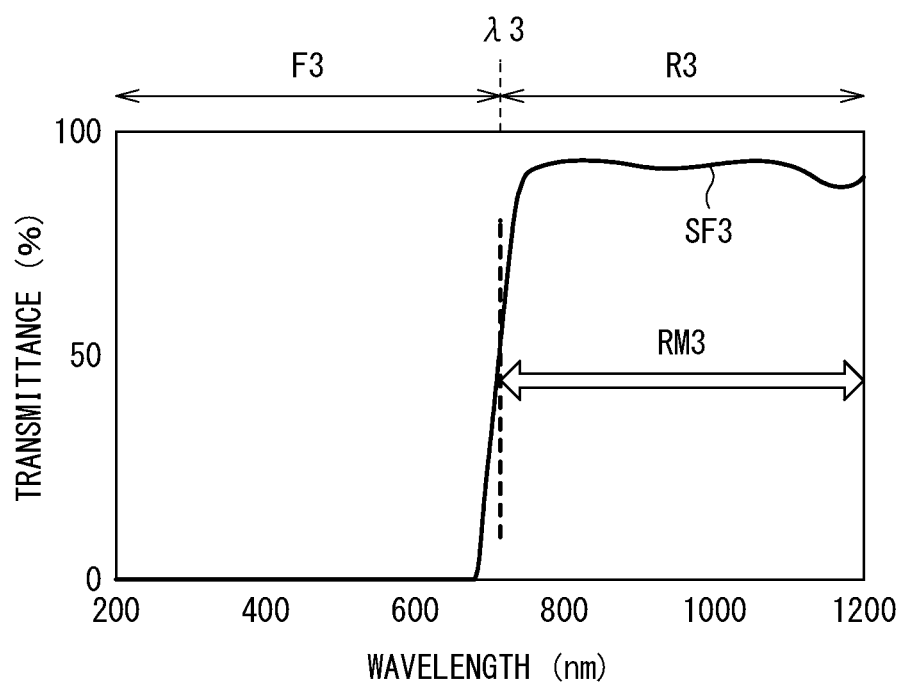

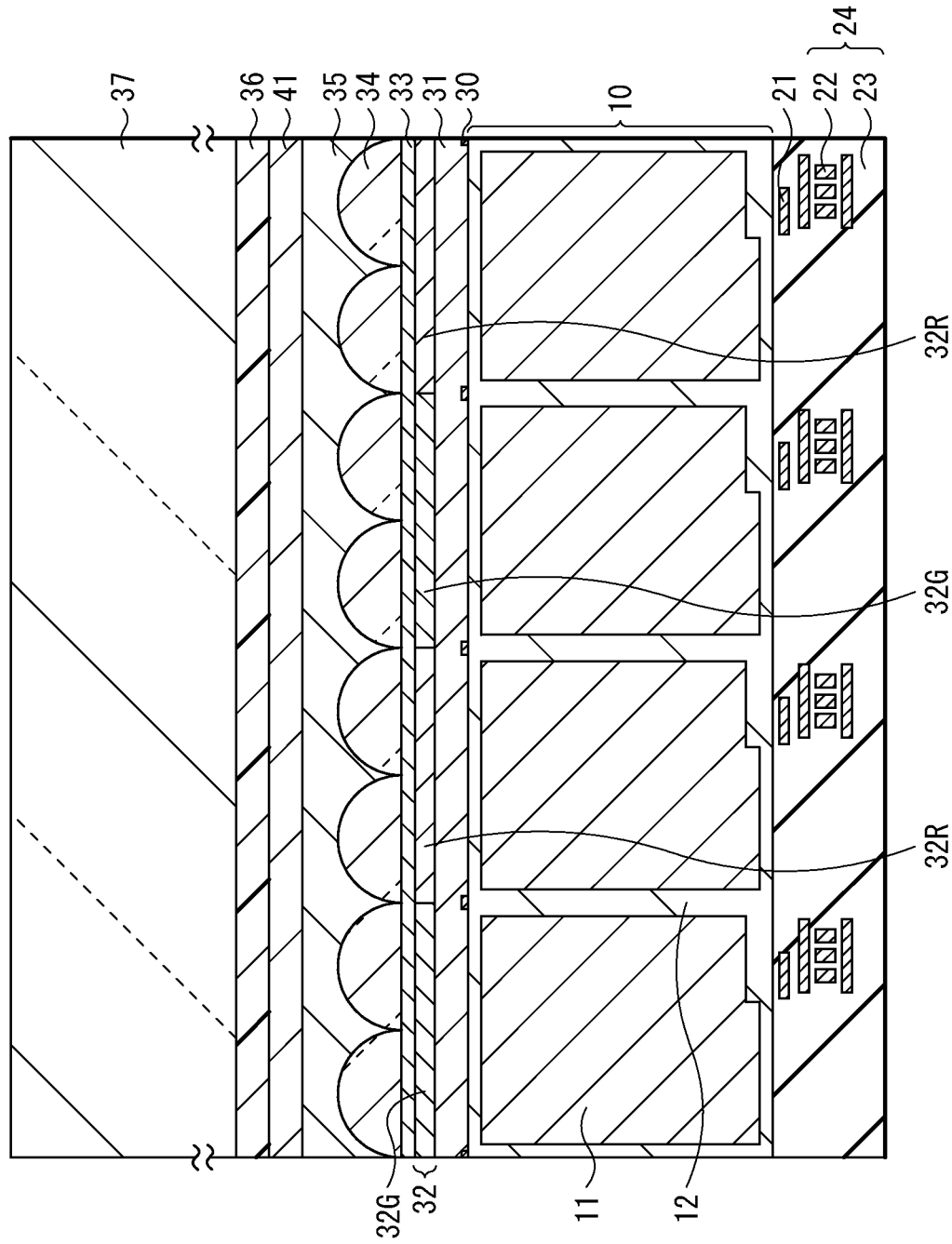
[FIG. 29]

[FIG. 30]
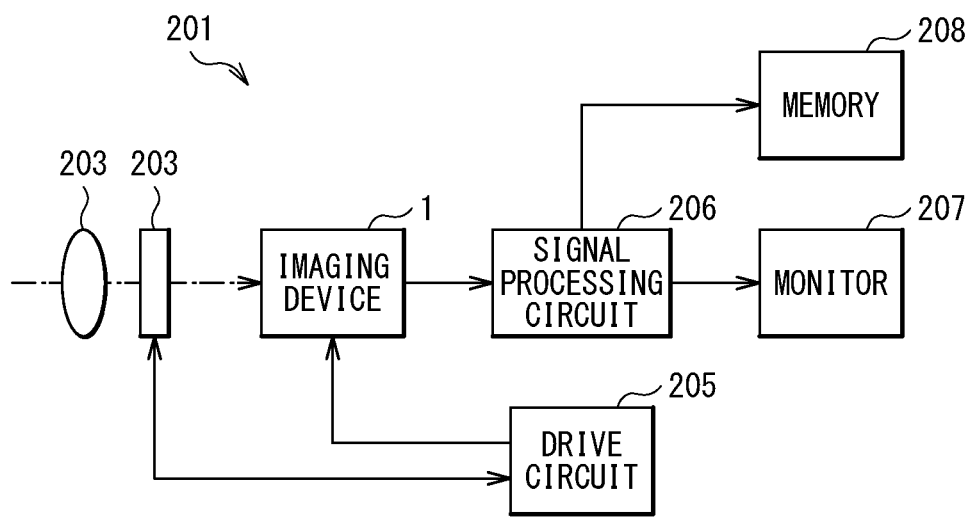
[FIG. 31]
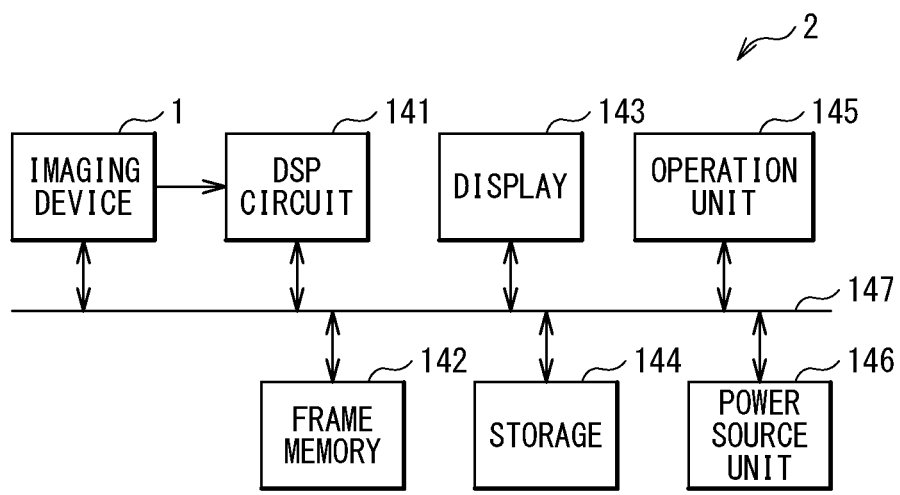

[FIG. 32]
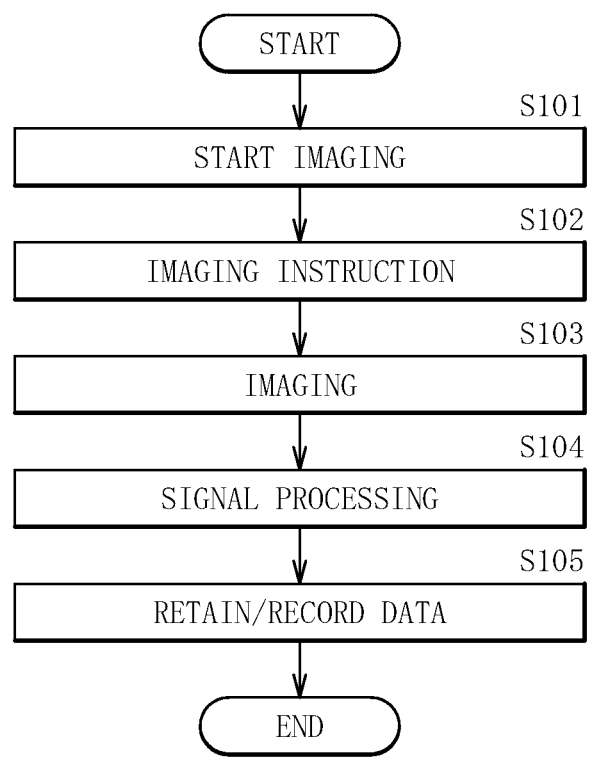

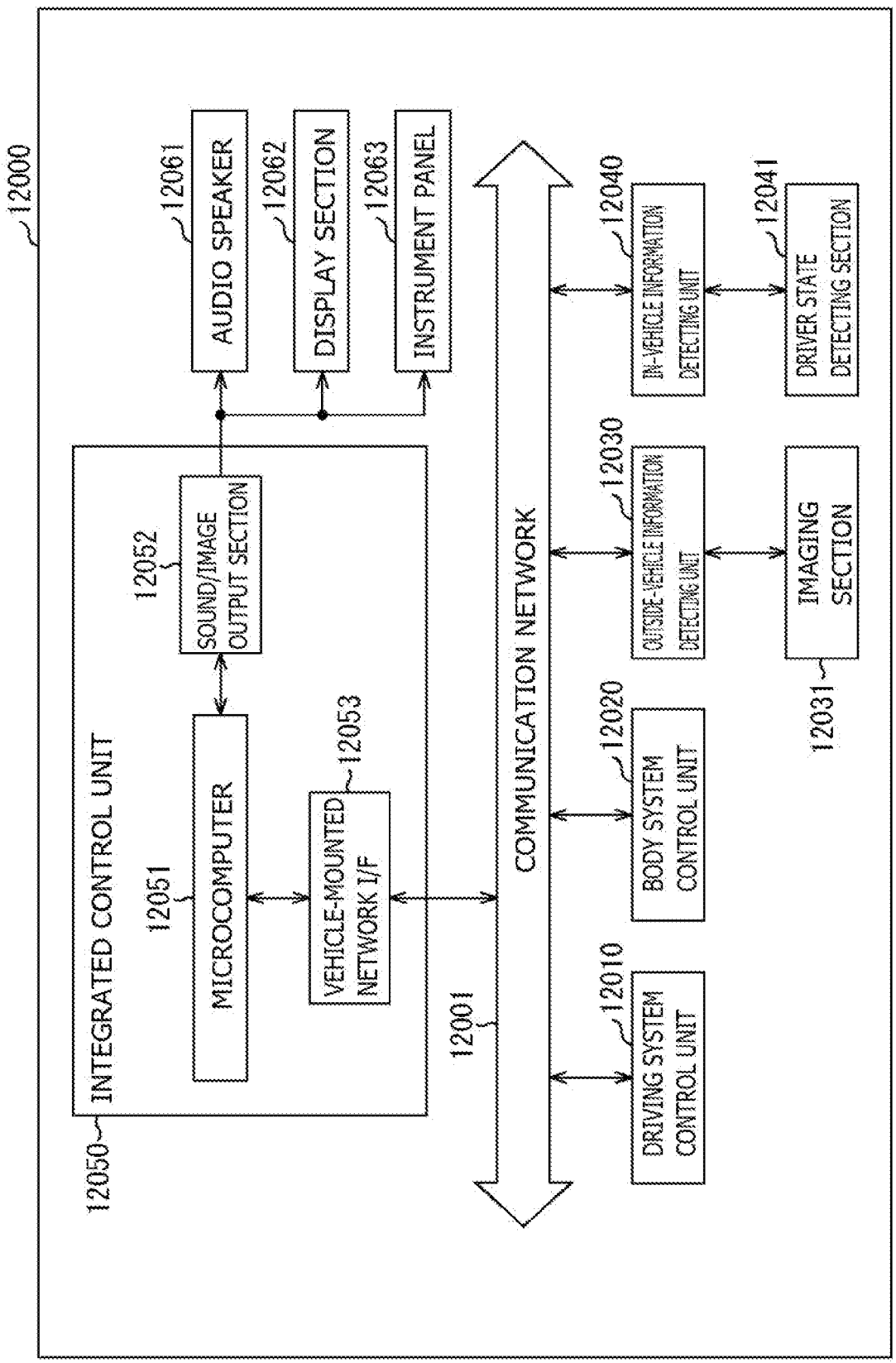
[FIG. 33]

[FIG. 34]
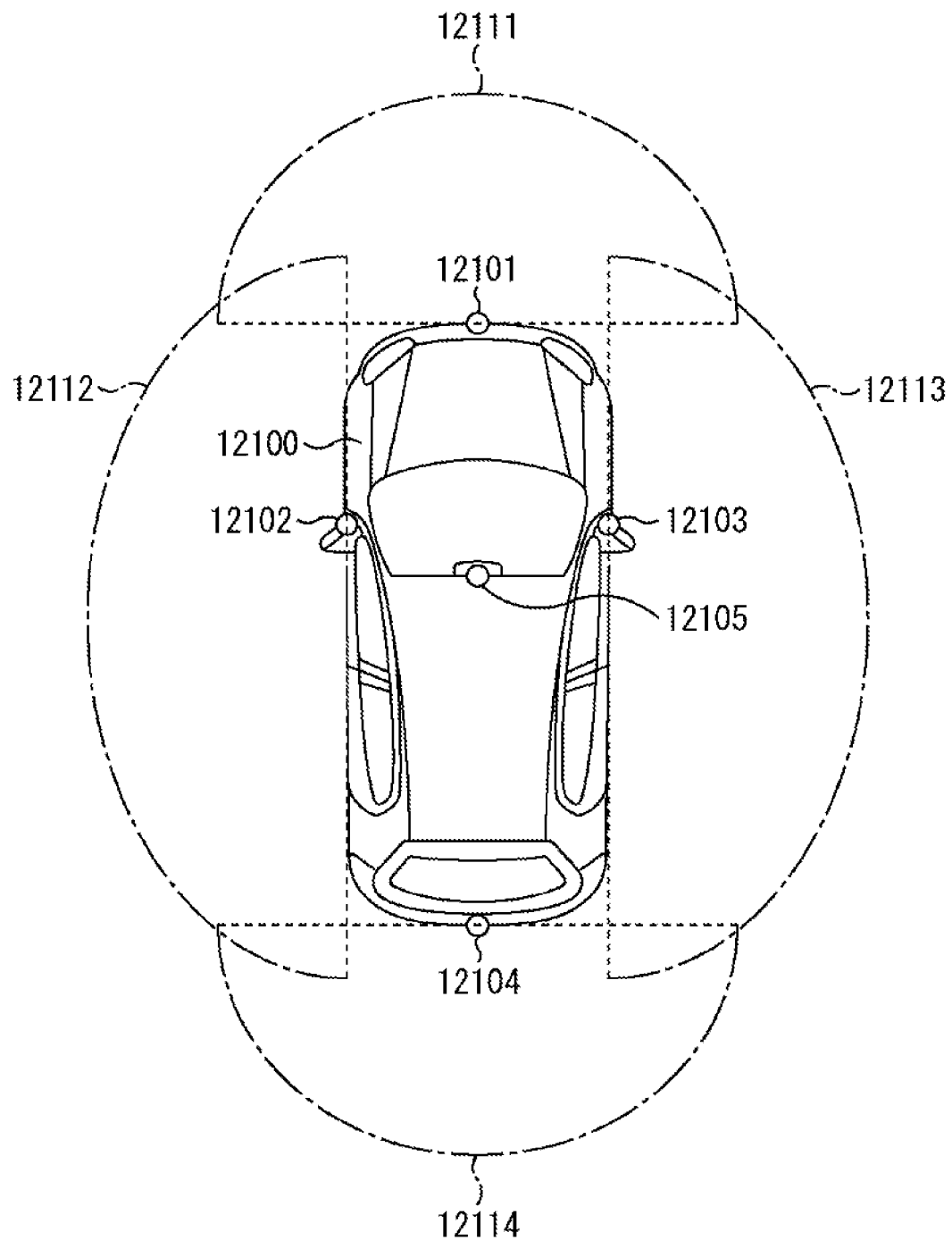

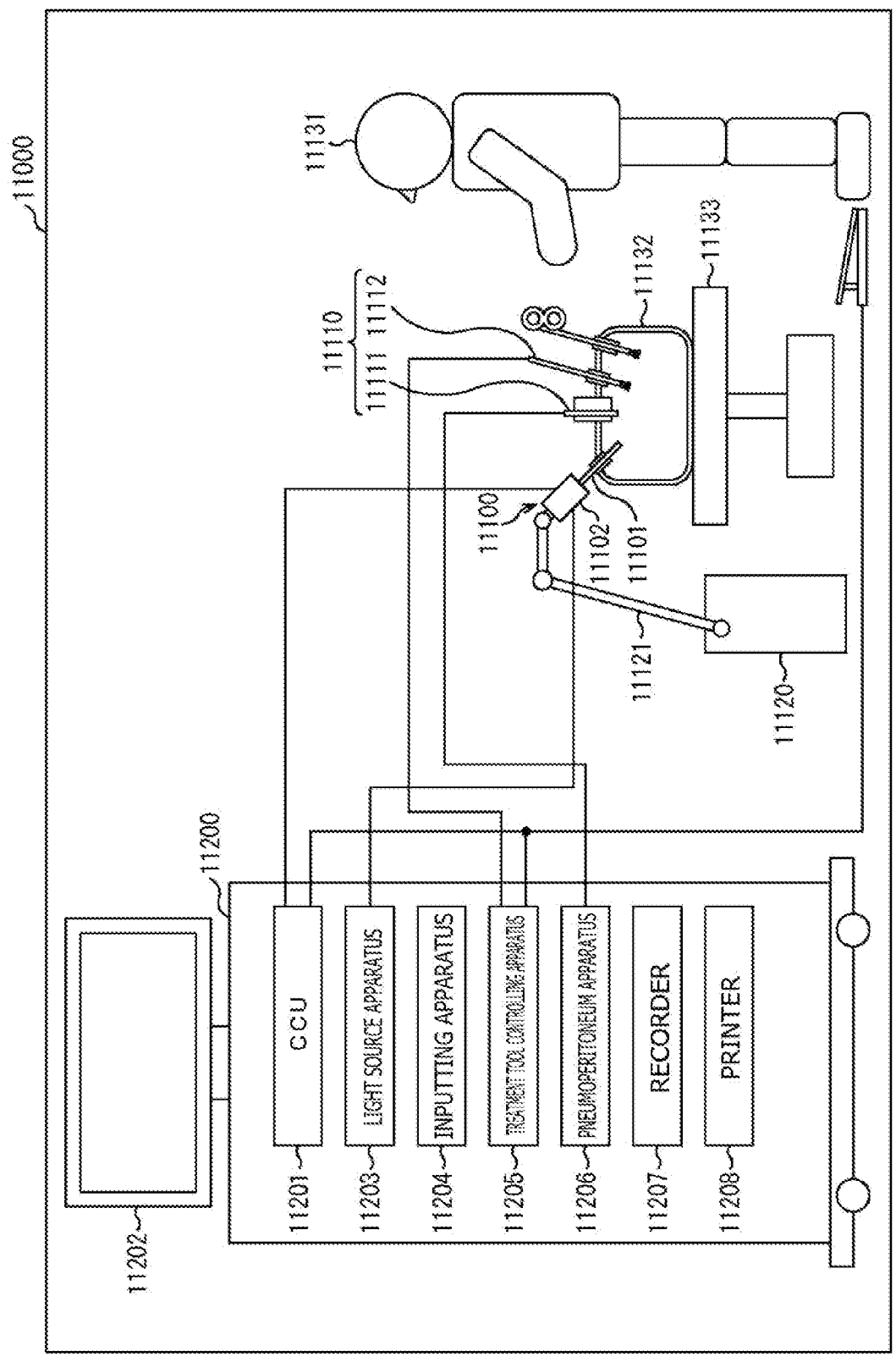
[FIG. 35]

[FIG. 36]
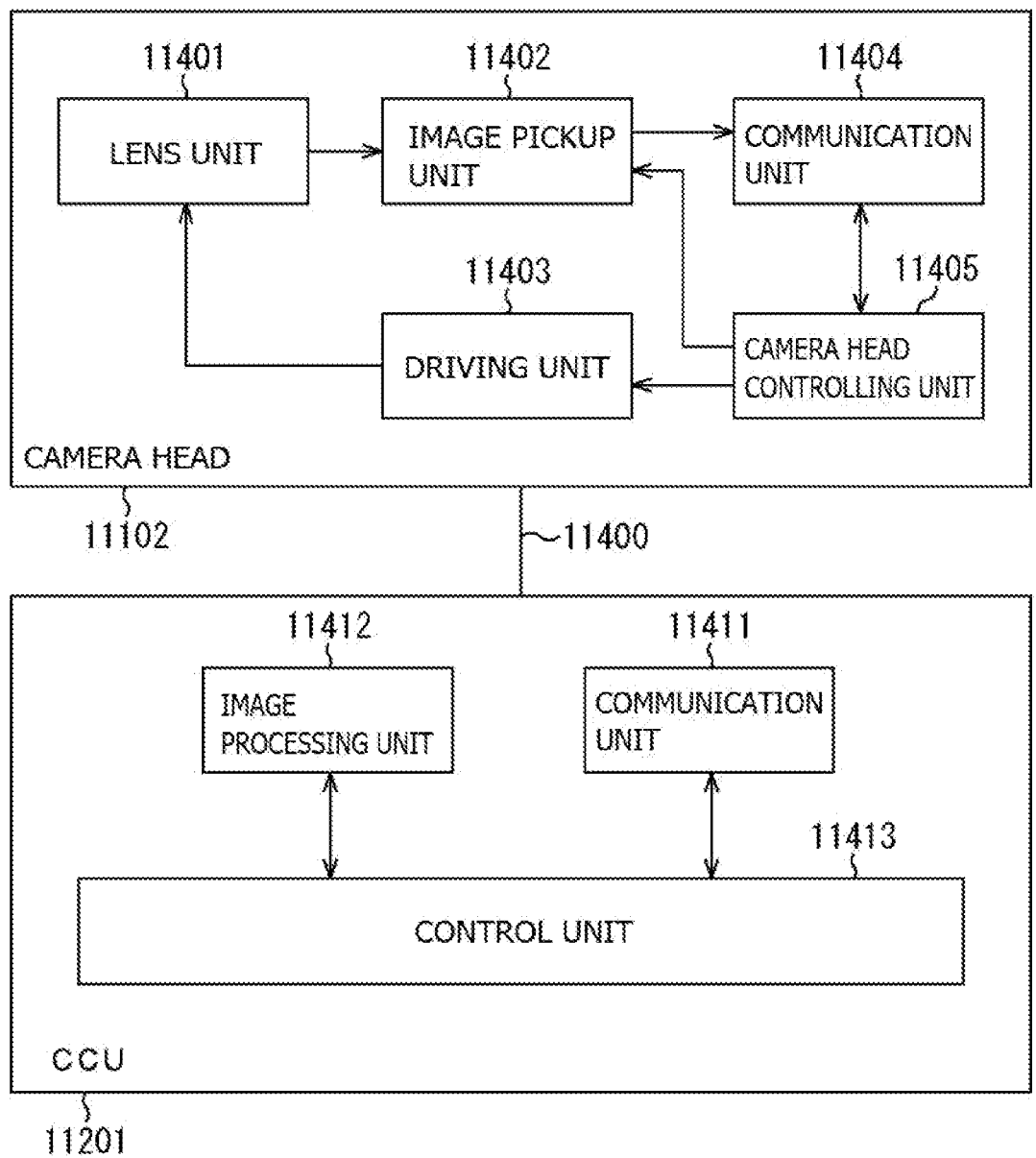

IMAGING DEVICE AND ELECTRONIC APPARATUS FOR FLARE REDUCTION IN AN ON-CHIP LENS ARRAY

CROSS REFERENCE TO RELATED APPLICATIONS

This application is a U.S. National Phase of International Patent Application No. PCT/JP2020/000457 filed on Jan. 9, 2020, which claims priority benefit of Japanese Patent Application No. JP 2019-006276 filed in the Japan Patent Office on Jan. 17, 2019. Each of the above-referenced applications is hereby incorporated herein by reference in its entirety.

TECHNICAL FIELD

The present disclosure relates to: an imaging device; and an electronic apparatus including such an imaging device.

BACKGROUND ART

A configuration of an imaging device is known in which on-chip lens is provided on a light incident surface of a pixel that performs photoelectric conversion (for example, see PTL 1 and PTL 2). The on-chip lens enhances a photoelectric conversion efficiency in a light reception section by condensing light that enters the light reception section.

PTL 1 discloses an imaging device in which a plurality of on-chip lenses is densely provided in a single plane on one pixel.

PTL 2 discloses an imaging device including: a pixel region in which pixels are arrayed; on-chip lenses; and a light-shielding film formed at borders of the pixels.

CITATION LIST

Patent Literature

PTL 1: Japanese Unexamined Patent Application Publication No. 2013-143431
PTL 2: Japanese Unexamined Patent Application Publication No. 2010-186818

SUMMARY OF THE INVENTION

It is desired that, in such an imaging device, flare be reduced. The flare is generated by: occurrence of a diffraction phenomenon at a time when incident light entering a pixel is reflected on regularly disposed on-chip lenses or the like; reflection of the incident light at various angles, from a close-to-perpendicular angle to a far-from-perpendicular angle; and entering of the incident light into a pixel away from a pixel into which the entering light supposed to enter.

It is desirable to provide an imaging device and an electronic apparatus that are able to reduce flare.

An imaging device according to an embodiment of the present disclosure includes: a light reception section; a plurality of on-chip lenses; and a transparent substrate. The light reception section has a plurality of pixels that performs photoelectric conversion. The on-chip lenses are provided on a light incident side of the light reception section at a pitch less than a length of a wavelength on a longest wavelength side of a wavelength region of light to be received by the light reception section. The transparent substrate is provided on a light incident side of the plurality of on-chip lenses.

An electronic apparatus according to an embodiment of the present disclosure includes: an optical system; an imaging device; and a signal processing circuit. The electronic apparatus includes, as the imaging device, the imaging device according to the above-described embodiment of the present disclosure.

The imaging device and the electronic apparatus according to the embodiments of the present disclosure are provided with the on-chip lenses on the light incident side of the light reception section of the imaging device, and the pitch of the on-chip lens is less than the length of the wavelength on the longest wavelength side of the wavelength region of the light to be received by the light reception section. This suppresses the diffraction phenomenon that may occur when the light to be received that enters the imaging device is reflected on the on-chip lens.

BRIEF DESCRIPTION OF DRAWINGS

FIG. 1 is a diagram illustrating an example of a plane configuration of an imaging device according to an embodiment of the present disclosure.

FIG. 2 is a diagram illustrating an example of a cross-sectional configuration taken along I-I' of the imaging device of FIG. 1.

FIG. 3A is a diagram illustrating an example of a diffraction phenomenon of reflected light in the imaging device according to FIG. 1.

FIG. 3B is an enlarged view of a main part of FIG. 3A.

FIG. 4 is a diagram illustrating a wavelength region of light to be received by a light reception section included in the imaging device of FIG. 1.

FIG. 5A is a diagram illustrating an example of a plane configuration of a process of manufacturing the imaging device of FIG. 1.

FIG. 5B is a diagram illustrating an example of a cross-sectional configuration taken along II-II' of FIG. 5A.

FIG. 5C is a diagram illustrating an example of a cross-sectional configuration taken along III-III' of FIG. 5A.

FIG. 6A is a diagram illustrating an example of a plane configuration of a manufacturing process following FIG. 5A.

FIG. 6B is a diagram illustrating an example of a cross-sectional configuration taken along II-II' of FIG. 6A.

FIG. 6C is a diagram illustrating an example of a cross-sectional configuration taken along III-III' of FIG. 6A.

FIG. 7A is a diagram illustrating an example of a plane configuration of a manufacturing process following FIG. 6A.

FIG. 7B is a diagram illustrating an example of a cross-sectional configuration taken along II-II' of FIG. 7A.

FIG. 7C is a diagram illustrating an example of a cross-sectional configuration taken along III-III' of FIG. 7A.

FIG. 8A is a diagram illustrating an example of a plane configuration of a manufacturing process following FIG. 7A.

FIG. 8B is a diagram illustrating an example of a cross-sectional configuration taken along II-II' of FIG. 8A.

FIG. 8C is a diagram illustrating an example of a cross-sectional configuration taken along III-III' of FIG. 8A.

FIG. 9A is a diagram illustrating an example of a plane configuration of a manufacturing process following FIG. 8A.

FIG. 9B is a diagram illustrating an example of a cross-sectional configuration taken along II-II' of FIG. 9A.

FIG. 9C is a diagram illustrating an example of a cross-sectional configuration taken along III-III' of FIG. 9A.

FIG. 10A is a diagram illustrating an example of a plane configuration of a manufacturing process following FIG. 9A.

FIG. 10B is a diagram illustrating an example of a cross-sectional configuration taken along III-III' of FIG. 10A.

FIG. 11A is a diagram illustrating an example of a plane configuration of a manufacturing process following FIG. 10A.

FIG. 11B is a diagram illustrating an example of a cross-sectional configuration taken along III-III' of FIG. 11A.

FIG. 12A is a diagram illustrating an example of a plane configuration of a manufacturing process following FIG. 11A.

FIG. 12B is a diagram illustrating an example of a cross-sectional configuration taken along III-III' of FIG. 12A.

FIG. 13A is a diagram illustrating an example of a plane configuration of a manufacturing process following FIG. 12A.

FIG. 13B is a diagram illustrating an example of a cross-sectional configuration taken along III-III' of FIG. 13A.

FIG. 14A is a diagram illustrating an example of a plane configuration of a manufacturing process following FIG. 13A.

FIG. 14B is a diagram illustrating an example of a cross-sectional configuration taken along III-III' of FIG. 14A.

FIG. 15A is a diagram illustrating an example of a plane configuration of a manufacturing process following FIG. 14A.

FIG. 15B is a diagram illustrating an example of a cross-sectional configuration taken along III-III' of FIG. 15A.

FIG. 16 is a block diagram illustrating a configuration of the imaging device of FIG. 1.

FIG. 17A is a diagram illustrating an example of a diffraction phenomenon of reflected light in an imaging device according to a reference embodiment.

FIG. 17B is an enlarged view of a main part of FIG. 17A.

FIG. 18A is a diagram illustrating an example of a plane configuration of a process of manufacturing an imaging device according to a modification example A.

FIG. 18B is a diagram illustrating an example of a cross-sectional configuration taken along III-III' of FIG. 18A.

FIG. 19A is a diagram illustrating an example of a plane configuration of a manufacturing process following FIG. 18A.

FIG. 19B is a diagram illustrating an example of a cross-sectional configuration taken along III-III' of FIG. 19A.

FIG. 20A is a diagram illustrating an example of a plane configuration of a manufacturing process following FIG. 19A.

FIG. 20B is a diagram illustrating an example of a cross-sectional configuration taken along III-III' of FIG. 20A.

FIG. 21A is a diagram illustrating an example of a plane configuration of a manufacturing process following FIG. 20A.

FIG. 21B is a diagram illustrating an example of a cross-sectional configuration taken along III-III' of FIG. 21A.

FIG. 22A is a diagram illustrating an example of a plane configuration of a manufacturing process following FIG. 21A.

FIG. 22B is a diagram illustrating an example of a cross-sectional configuration taken along III-III' of FIG. 22A.

FIG. 23 is a diagram illustrating a wavelength region of light to be received by a light reception section included in an imaging device according to a modification example B.

FIG. 24 is a diagram illustrating a wavelength region of light to be received by a light reception section included in an imaging device according to a modification example C.

FIG. 25 is a diagram illustrating an example of a cross-sectional configuration of an imaging device according to a modification example D.

FIG. 26 is a diagram illustrating a wavelength region of light to be received by a light reception section included in the imaging device of FIG. 25.

FIG. 27 is a diagram illustrating another example of a wavelength region of light to be received by the light reception section included in the imaging device according to the modification example D.

FIG. 28 is a diagram illustrating another example of a wavelength region of light to be received by the light reception section included in the imaging device according to the modification example D.

FIG. 29 is a diagram illustrating an example of a cross-sectional configuration of an imaging device according to a modification example E.

FIG. 30 is a block diagram illustrating an example of a schematic configuration of an electronic apparatus including the imaging device according to the above-described embodiment and the modification examples thereof.

FIG. 31 is a diagram illustrating an example of a schematic configuration of an imaging system including the imaging device according to the above-described embodiment and the modification examples thereof.

FIG. 32 is a diagram illustrating an example of imaging processes in the imaging system of FIG. 31.

FIG. 33 is a block diagram depicting an example of schematic configuration of a vehicle control system.

FIG. 34 is a diagram of assistance in explaining an example of installation positions of an outside-vehicle information detecting section and an imaging section.

FIG. 35 is a view depicting an example of a schematic configuration of an endoscopic surgery system.

FIG. 36 is a block diagram depicting an example of a functional configuration of a camera head and a camera control unit (CCU).

MODES FOR CARRYING OUT THE INVENTION

In the following, an embodiment of the present disclosure is described in detail with reference to the drawings. It is to be noted that description is given in the following order.

1. Embodiment (Imaging Device) . . . FIGS. 1, 2, 3A, 3B, 4, 5A, 5B, 5C, 6A, 6B, 6C, 7A, 7B, 7C, 8A, 8B, 8C, 9A, 9B, 9C, 10A, 10B, 11A, 11B, 12A, 12B, 13A, 13B, 14A, 14B, 15A, and 15B An example in which a pitch of an on-chip lens is less than a length of a wavelength on a longest wavelength side of a wavelength region of light to be received by a light reception section 2. Modification Examples (Imaging Devices)

Modification Example A: An example in which on-chip lenses are formed by etch-back . . . FIGS. 18A, 18B, 19A, 19B, 20A, 20B, 21A, 21B, 22A, and 22B Modification Example B: An example in which light to be received by a light reception section is light in an ultraviolet region . . . FIG. 23

Modification Example C: An example in which light to be received by a light reception section is light in an infrared region . . . FIG. 24

Modification Example D: An example in which an external optical filter is provided . . . FIGS. 25 to 28

Modification Example E: An example in which a built-in optical filter is provided . . . FIG. 29

3. Application Examples

Application Example 1: An example in which the imaging device according to the above-described embodiment and the modification examples thereof is applied to an electronic apparatus . . . FIG. 30

Application Example 2: An example in which the imaging device according to the above-described embodiment and the modification examples thereof is applied to an imaging system . . . FIGS. 31 and 32

4. Practical Application Examples

Practical Application Example 1: An example in which the imaging device according to the above-described embodiment and the modification examples thereof is practically applied to a mobile body . . . FIGS. 33 and 34

Practical Application Example 2: An example in which the imaging device according to the above-described embodiment and the modification examples thereof is practically applied to a surgery system . . . FIGS. 35 and 36

1. Embodiment

Configuration Example

FIG. 1 is a diagram illustrating an example of a plane configuration of an imaging device 1 according to an embodiment of the present disclosure. FIG. 2 illustrates an example of a cross-sectional configuration taken along I-I' of the imaging device 1 of FIG. 1. In FIG. 1, a transparent substrate 37, an adhesion layer 36, an embedded layer 35, and a planarization film 33 are omitted in order to illustrate a layout of on-chip lenses 34 and color filters 32 (a red filter 32R, a green filter 32G, and a blue filter 32B).

The imaging device 1 includes a semiconductor substrate 10, a wiring layer 24, a light-shielding film 30, a planarization film 31, the color filters 32 (the red filter 32R, the green filter 32G, and the blue filter 32B), the planarization film 33, the on-chip lens 34, the embedded layer 35, the adhesion layer 36, and the transparent substrate 37. The on-chip lens 34 corresponds to a specific example of an "on-chip lens" of the present disclosure. The transparent substrate 37 corresponds to a specific example of a "transparent substrate" of the present disclosure. The semiconductor substrate 10 is provided with a photodiode PD that performs photoelectric conversion from an n-type semiconductor region 11 and a p-type semiconductor region 12. The photodiode PD is divided for each pixel PX by the p-type semiconductor region 12 or the like. Thus, the semiconductor substrate 10 is provided with a light reception section 10C having a plurality of pixels PX each performing photoelectric conversion. The light reception section 10C corresponds to a specific example of a "light reception section" of the present disclosure. FIG. 1 illustrates a plane configuration corresponding to 4×4=16 pixels, and FIG. 2 illustrates a cross-sectional configuration corresponding to 4 pixels. A wavelength region of light to be received by the light reception section 10C of the imaging device 1 is a visible region (e.g., greater than or equal to 400 nm and less than or equal to 700 nm).

One surface 10A of the semiconductor substrate 10 is provided with a transfer gate 21 that extracts signal charge generated and accumulated in the photodiode PD in each pixel PX. In addition, the wiring layer 24 is provided which includes: a wiring line 22; and an insulating layer 23 provided to embed the wiring line 22. The signal charge extracted from the photodiode PD of each pixel PX is subjected to signal processing such as CDS (correlated double sampling) processing by a signal processing circuit (not illustrated) coupled via the wiring layer 24, is converted into a digital signal, and is outputted to the outside.

Another surface 10B of the semiconductor substrate 10 is provided with the light-shielding film 30 in a border region between one pixel PX and an adjacent pixel PX. The light-shielding film 30 includes a light-shielding metal such as aluminum or tungsten, or another light-shielding material. The planarization film 31 is formed to cover the light-shielding film 30. The planarization film 31 includes a light-transmissive insulating material such as silicon oxide or hafnium oxide.

The color filters 32 are formed on the planarization film 31. The color filters 32 include, for example, the red filter 32R, the green filter 32G, and the blue filter 32B, and one filter selected from the red filter 32R, the green filter 32G, and the blue filter 32B is provided for one pixel PX. Here, the wavelength region of the light to be received by the imaging device 1 is the visible region (greater than or equal to 400 nm and less than or equal to 700 nm), the red filter is formed on the red pixel, the green filter is formed on the green pixel, and the blue filter is formed on the blue pixel. The color filters 32 (the red filter 32R, the green filter 32G, and the blue filter 32B) include photosensitive negative resist materials or the like containing dyes of the respective colors. For example, the color filters 32 (the red filter 32R, the green filter 32G, and the blue filter 32B) are provided in a Bayer array. In the Bayer array, in any 2×2=4 pixels, color filters of two pixels PX disposed on one diagonal line are both green filters 32G. Further, color filters of the two pixels PX disposed on another diagonal line is the red filter 32R and the blue filter 32B. The color filters 32 are not limited to the red filter 32R, the green filter 32G, and the blue filter 32B, and may include at least one of, for example, the red filter, the green filter, the blue filter, a yellow filter, a magenta filter, a cyan filter, or a gray filter.

The planarization film 33 is formed on the color filters 32 (the red filter 32R, the green filter 32G, and the blue filter 32B). The planarization film 33 includes a light-transmissive material such as, for example, an acrylic resin.

A plurality of on-chip lenses 34 is formed on the planarization film 33. The on-chip lenses 34 each include a light-transmissive material such as a thermoplastic positive photosensitive resin or silicon nitride (having a refractive index of 1.95), for example. The on-chip lenses 34 are provided in a pitch less than a length of a wavelength of a longest wavelength side of the wavelength region of the light to be received by the light reception section 10C. The wavelength region of the light to be received by the light reception section 10C is greater than or equal to 400 nm and less than or equal to 700 nm; thus, the pitch of the on-chip lens 34 is less than 700 nm. The on-chip lenses 34 are preferably provided in a pitch less than a length of a wavelength of a shortest wavelength side (400 nm) of the wavelength region of the light to be received by the light reception section 10C. As a result, it is possible to suppress occurrence of a diffraction phenomenon when the light to be received that enters the imaging device is reflected on the on-chip lens 34. The suppression of the diffraction phenomenon will be described later.

Here, one on-chip lens 34 is not disposed across a plurality of pixels PX. This is because the disposition of one on-chip lens 34 across a plurality of pixel PX causes color mixture. In a case where a pixel pitch P (a pixel size) of the pixel PX is about 1 m, for example, it is possible to achieve a configuration in which the pitch of the on-chip lens 34 is less than 700 nm, for example, by causing the pitch of the on-chip lens 34 to be less than or equal to ½ of the pixel pitch P, e.g., ½ or ⅓ of the pixel pitch P. The pitch of the on-chip lens 34 may be less than or equal to ¼ of the pixel pitch P. However, the on-chip lens 34 having a pitch of less than or equal to ¼ of the pixel pitch P is too small that it is difficult to be formed. In a case where the pitch of the on-chip lens 34 is ½ of the pixel pitch P, 2×2=4 pieces of on-chip lenses 34 are disposed in one pixel PX. In a case where the pitch of the on-chip lens 34 is ⅓ of the pixel pitch P, 3×3=9 pieces of on-chip lenses 34 are disposed in one pixel PX.

The pitch of the on-chip lens 34 is preferably less than 400 nm, and it is possible to achieve this configuration by, for example, setting the pitch of the on-chip lens 34 to ½ or ⅓ of the pixel pitch P. The pitch of the on-chip lens 34 may be less than or equal to ¼ of the pixel pitch P.

The embedded layer 35 that seals surfaces of the on-chip lenses 34 is formed on the on-chip lenses 34. The transparent substrate 37 is bonded over the embedded layer 35 via the adhesion layer 36.

In the imaging device 1, the embedded layer 35 is provided between the on-chip lenses 34 and the transparent substrate 37. Unlike the imaging device 1, in a case where the transparent substrate 37 is held in a holder or the like spaced apart from the on-chip lenses 34, a space (a cavity) exists between the on-chip lenses 34 and the transparent substrate 37. An imaging device having such a structure is referred to as cavity-type imaging device. In the imaging device 1, there is no space (cavity) between the on-chip lenses 34 and the transparent substrate 37. An imaging device having such a structure is referred to as cavity-less imaging device.

In the cavity-type imaging device, the space (the cavity) is provided by holding the transparent substrate with the holder or the like, and it is difficult to miniaturize the device because of the configuration of holding the transparent substrate and the configuration of having the space (the cavity), whereas it is possible to miniaturize the device in the imaging device having the cavity-less structure.

The embedded layer 35 includes a light-transmissive material having a refractive index lower than that of the on-chip lens 34, such as, for example, a hollow silica-containing resin or a fluorine-containing siloxane resin (having a refractive index of 1.41). The adhesion layer 36 includes a light-transmissive adhesive such as an epoxy-based resin, for example. The transparent substrate 37 is, for example, a glass substrate (having a refractive index of 1.5).

In the imaging device 1, a surface on a light incident side of the transparent substrate 37 is in contact with the air (having a refractive index of 1.0), and a refractive index of the transparent substrate 37 and a refractive index of the on-chip lens 34 are each higher than the refractive index of the air. For example, the transparent substrate 37 is the glass substrate (having a refractive index of 1.5), and the on-chip lens 34 includes silicon nitride (having a refractive index of 1.95). In addition, a refractive index of the embedded layer 35 is higher than the refractive index of the air. For example, the embedded layer 35 includes the fluorine-containing siloxane resin (having a refractive index of 1.41).

The imaging device 1 having the above-described configuration has repetitive patterns of the on-chip lenses 34, the color filters 32 (the red filter 32R, the green filter 32G, and the blue filter 32B), and the like. The diffraction phenomenon of the reflected light caused by these repetitive patterns will be described in detail later. In the imaging device 1, the wavelength region of the light to be received is the visible region (for example, greater than or equal to 400 nm and less than or equal to 700 nm), and the on-chip lenses 34 are provided in a pitch less than the length of the wavelength on the longest wavelength side (700 nm) of the wavelength region of the light to be received by the light reception section 10C, as described above. Therefore, as illustrated in FIGS. 3A and 3B, it is possible to suppress the occurrence of the diffraction phenomenon when the light having the wavelength greater than or equal to the pitch of the on-chip lens 34 in the visible region (e.g., greater than or equal to 400 nm and less than or equal to 700 nm) which is the light to be received is reflected on the on-chip lens 34. As a result, it is possible to suppress the generation of flare in the imaging device 1. The suppression of the diffraction phenomenon and the suppression of flare will be described in detail later.

FIG. 4 illustrates an example of the wavelength region of the light to be received by the light reception section 10C of the imaging device 1. A wavelength region RM1 of the light to be received by the imaging device 1 is greater than or equal to 400 nm and less than or equal to 700 nm. Here, in a case where the pitch of the on-chip lens 34 of the imaging device 1 corresponds to a magnitude of a wavelength $\lambda 1$, it is possible to suppress the occurrence of the diffraction phenomenon when light in a wavelength region R1 which is on the longer wavelength side than the wavelength $\lambda 1$ is reflected on the on-chip lens 34. The wavelength $\lambda 1$ is less than the wavelength on the longest wavelength side (700 nm) of the wavelength region of the light to be received, which makes it possible to suppress generation of reflected diffracted light for at least a portion of light (light of greater than or equal to $\lambda 1$ and less than or equal to 700 nm) in the wavelength region RM1 (greater than or equal to 400 nm and less than or equal to 700 nm) of the light to be received. The wavelength $\lambda 1$ is preferably less than the wavelength on the shortest wavelength side (400 nm) of the wavelength region of the light to be received. In this case, it is possible to suppress the generation of the reflected diffracted light in the entire region of the wavelength region RM1 (greater than or equal to 400 nm and less than or equal to 700 nm) of the light to be received.

Manufacturing Method

Next, a method of manufacturing the imaging device 1 will be described. FIGS. 5A, 5B, 5C, 6A, 6B, 6C, 7A, 7B, 7C, 8A, 8B, 8C, 9A, 9B, 9C, 10A, 10B, 11A, 11B, 12A, 12B, 13A, 13B, 14A, 14B, 15A, and 15B illustrate examples of manufacturing processes of the imaging device 1.

First, as illustrated in FIGS. 5A, 5B, and 5C, the n-type semiconductor region 11 and the p-type semiconductor region 12 are formed on the semiconductor substrate 10 by ion implantation or the like, and the photodiode PD that performs photoelectric conversion is formed. Next, a light-shielding material such as aluminum is deposited on the surface 10B of the semiconductor substrate 10 by sputtering, for example, and is patterned so as to leave a border region between one pixel PX and an adjacent pixel PX to form the light-shielding film 30.

Subsequently, as illustrated in FIGS. 6A, 6B, and 6C, a light-transmissive insulating material such as silicon oxide is deposited by, for example, a CVD (Chemical Vapor Deposition) method or the like, to thereby form the planarization film 31.

Next, as illustrated in FIGS. 7A, 7B, and 7C, the green filter 32G is formed on the planarization film 31 in the green pixel by a photosensitive negative resist material including a green dye. As a method of forming the green filter 32G, for example, the photosensitive negative resist material including the green dye is applied, and a pre-baking process is performed. Next, the photosensitive negative resist material is subjected to an exposure process to a pattern to be left in the green pixel, a development process, and a post-baking process.

Subsequently, as illustrated in FIGS. 8A, 8B, and 8C, the red filter 32R is formed on the planarization film 31 in the red pixel by a photosensitive negative resist material including a red dye in a similar manner as the forming of the green filter 32G described above.

Next, as illustrated in FIGS. 9A, 9B, and 9C, the blue filter 32B is formed on the planarization film 31 in the blue pixel by a photosensitive negative resist material including a blue dye in a similar manner as the forming of the green filter 32G described above. In the subsequent processes, cross-sectional configurations taken along II-II' in FIG. 9A and cross-sectional configurations taken along III-III' in FIG. 9A are similar to each other; hence, the cross-sectional configurations taken along II-II' will be omitted.

Subsequently, as illustrated in FIGS. 10A and 10B, a light-transmissive material such as an acrylic resin is applied on the color filters 32 (the red filter 32R, the green filter 32G, and the blue filter 32B) and is subjected to a baking process to form the planarization film 33.

Next, as illustrated in FIGS. 11A and 11B, for example, a light-transmissive material such as a thermoplastic positive photosensitive resin is applied and subjected to the pre-baking process. Subsequently, the exposure process and the development process are performed with a pattern that the pitch of the on-chip lens 34 formed after a thermal reflow process to be described later is less than 700 nm to form a resin layer 34A. Here, 700 nm is a wavelength on the longest wavelength side of the wavelength region of the light to be received by the light reception section 10C. Next, the resin layer 34A is subjected to a bleaching (decoloring) exposure process as necessary. This is because, in a case where naphthoquinone diazide is used for a photosensitive material included in the resin layer 34A, the naphthoquinone diazide absorbs light in the visible region, which causes decolorization (impartation of transparency) owing to the exposure.

Subsequently, as illustrated in FIGS. 12A and 12B, the baking process is performed at a temperature of higher than or equal to a thermal softening point of the resin layer 34A (for example, 120° C. to 180° C.), whereby the resin layer 34A is softened (reflowed) to form lens-shaped on-chip lenses 34. By softening the resin layer 34A at the temperature of higher than or equal to the thermal softening point, a surface of the resin layer 34A becomes a lens-shaped curved surface owing to surface tension. Here, in a case where a gap is generated between the on-chip lenses 34, an inorganic material such as silicon nitride or silicon oxynitride may be formed so as to fill the gap (so as to reduce) the gap. Reduction in the gap increases an effective area of the on-chip lenses 34, and enhances a sensitivity characteristic of the imaging device.

Next, as illustrated in FIGS. 13A and 13B, a light-transmissive material having a refractive index lower than a refractive index of the on-chip lens 34, such as the hollow silica-containing resin, is applied on the on-chip lenses 34, and is subjected to the baking process to thereby form the embedded layer 35.

Subsequently, as illustrated in FIGS. 14A and 14B, an epoxy-based resin is applied on the embedded layer 35, and is subjected to the baking process at a temperature of higher than or equal to 80° C. and lower than or equal to 120° C. to thereby form the adhesion layer 36.

Next, as illustrated in FIGS. 15A and 15B, the transparent substrate 37 such as a glass substrate is bonded to the adhesion layer 36, and is subjected to the baking process at a temperature of higher than or equal to 130° C. and lower than or equal to 200° C. to thereby fix the transparent substrate. Further, the wiring layer 24 including the wiring line 22 and the insulating layer 23 may be formed as appropriate after the formation of the photodiode PD, prior to the formation of the light-shielding film 30, or the like. The imaging device 1 is manufactured in this manner.

Operation

In the imaging device 1, when the light having a wavelength of the light to be received enters the photodiode PD provided to the semiconductor substrate 10 from the light incident side (a transparent substrate 37 side), the signal charge is generated and accumulated. The signal charge is taken out from the photodiode PD of each pixel PX via the transfer gate 21, subjected to signal processing such as CDS (correlated double sampling) processing by the signal processing circuit (not illustrated) coupled via the wiring layer 24, is converted into the digital signal, and is outputted to the outside.

Overall Configuration of Imaging Device

FIG. 16 illustrates an overall configuration of the imaging device 1. The imaging device 1 takes in incident light (image light) from a subject via a lens system (not illustrated) and converts an amount of the incident light that forms an image on an imaging plane into an electric signal for each pixel and outputs the electric signal as a pixel signal. The imaging device 1 includes a pixel section 100 serving as an imaging area on the semiconductor substrate 10, and includes, for example, a vertical drive circuit 111, a column signal processing circuit 112, a horizontal drive circuit 113, an output circuit 114, a control circuit 115, and an input/output terminal (not illustrated), in a peripheral region of the pixel section 100.

The pixel section 100 includes, for example, a plurality of unit pixels P arranged two-dimensionally in a matrix. In the unit pixels P, for example, a pixel drive line Lread (specifically, a row selection line and a reset control line) is wired for each pixel row, and a vertical signal line Lsig is wired for each pixel column. The pixel drive line Lread transmits a drive signal for reading a signal from the pixel. One end of the pixel drive line Lread is coupled to an output end corresponding to each row of the vertical drive circuit 111.

The vertical drive circuit 111 includes a shift register, an address decoder, and the like, and is a pixel driver that drives each unit pixel P of the pixel section 100 in units of rows, for example. The signals outputted from the respective unit pixels P of a pixel row selectively scanned by the vertical drive circuit 111 are supplied to the column signal processing circuit 112 through the respective vertical signal lines Lsig. The column signal processing circuit 112 includes an amplifier, a horizontal selection switch, and the like that are provided for each vertical signal line Lsig.

The horizontal drive circuit 113 includes a shift register, an address decoder, and the like, and drives each horizontal selection switch of the column signal processing circuit 112 in order while scanning. As a result of the selective scanning performed by the horizontal drive circuit 113, the signals of the respective pixels transmitted through the respective vertical signal lines Lsig are sequentially outputted to the horizontal signal line 121 and transmitted to the outside of the semiconductor substrate 10 through the horizontal signal line 121.

The output circuit 114 performs signal processing on signals sequentially supplied from the respective column signal processing circuits 112 through the horizontal signal line 121 and outputs the signals. For example, the output circuit 114 may perform only buffering, or may perform black-level adjustment, column variation correction, various types of digital signal processing, and the like.

The circuits including the vertical drive circuit 111, the column signal processing circuit 112, the horizontal drive circuit 113, the horizontal signal line 121, and the output circuit 114 may be formed directly on the semiconductor substrate 10 or may be provided on an external control IC. In addition, those circuits may be formed on another substrate coupled by a cable or the like.

The control circuit 115 receives a clock supplied from the outside of the semiconductor substrate 10, data for instructing an operation mode, and the like, and outputs data such as internal data of the imaging device 1. The control circuit 115 further includes a timing generator that generates various timing signals, and performs drive control of a peripheral circuit such as the vertical drive circuit 111, the column signal processing circuit 112, or the horizontal drive circuit 113, on the basis of the various timing signals generated by the timing generator.

The input/output terminal exchanges signals with the outside.

Workings and Effects

The imaging device 1 according to the present embodiment has repetitive patterns of the on-chip lenses 34, the color filters 32 (the red filter 32R, the green filter 32G, and the blue filter 32B), and the like. The diffraction phenomenon of reflected light generated due to the repetitive patterns of the on-chip lenses 34, the color filters 32, and the like will be described.

FIG. 3A illustrates an example of the diffraction phenomenon of the reflected light in the imaging device 1. FIG. 3B is an enlarged view of a main part of FIG. 3A. The color filters 32, the on-chip lenses 34, and the embedded layer 35 are formed over the semiconductor substrate 10, and the transparent substrate 37 is bonded thereto. In FIGS. 3A and 3B, the wiring layer 24, the light-shielding film 30, the planarization film 31, the planarization film 33, and the adhesion layer 36 are omitted for simplicity. In the imaging device 1, one color filter 32 and 2×2=4 pieces of on-chip lenses 34 are provided for one pixel PX. With respect to the pixel pitch P, the pitch of the color filter 32 provided in Bayer array as described above is 2P. Further, the pitch of the on-chip lens 34 is ½P.

Considering the diffraction phenomenon that occurs when light is reflected in a diffraction grating having a grating space d, a condition for diffracted light to be reinforced is d sin $\theta$=m$\lambda$. Here, $\theta$ represents a diffraction angle, $\lambda$ represents a wavelength of light, and m represents a diffraction order. In a case where incident light LI enters the imaging device 1 and light reflected on the color filter 32 is diffracted, d is 2P, resulting in a plurality of reflected diffracted light beams DL2 satisfying 2P sin $\theta$=m$\lambda$. In FIGS. 3A and 3B, reflected diffracted light beams DL2 from the 0th order to the ±4th order are indicated by broken line arrows.

In contrast, in a case where light reflected on the on-chip lens 34 is diffracted, d is ½P. The equation for a condition for light of reflected diffracted light beam DL1 to be reinforced is ½P sin $\theta$=m$\lambda$. In a case where the pitch (½P) of the on-chip lens 34 is less than $\lambda$, no reflected diffracted light other than the 0th-order light which is necessarily generated is generated. In FIGS. 3A and 3B, the 0th-order reflected diffracted light beam DL1 is indicated by a solid arrow.

In the imaging device 1, the wavelength region of the light to be received is the visible region (e.g., greater than or equal to 400 nm and less than or equal to 700 nm), and the on-chip lens 34 is provided in a pitch less than the length of the wavelength on the longest wavelength side (700 nm) of the wavelength region of the light to be received by the light reception section 10C, as described above. Accordingly, for light having a wavelength greater than the pitch of the on-chip lens 34 out of the visible region (e.g., greater than or equal to 400 nm and less than or equal to 700 nm) of the light to be received, it is possible to suppress the occurrence of the diffraction phenomenon when the light to be received that enters the imaging device 1 is reflected on the on-chip lens 34. For example, in a case where the pitch of the on-chip lens 34 is less than 400 nm, it is possible to suppress the occurrence of the diffraction phenomenon when the light to be received that enters the imaging device 1 is reflected on the on-chip lens 34, for light having wavelengths in the entire range of the visible region (e.g., greater than or equal to 400 nm and less than or equal to 700 nm). The flare of the imaging device 1 is largely caused by diffracted light in which the reflected diffracted light from the color filter 32 and the reflected diffracted light from the on-chip lens 34 overlap each other; however, only the 0th-order light beams overlap with each other in the imaging device 1. No flare is generated from the 0th-order light, which makes it possible to suppress generation of the flare in the imaging device 1.

The above-described effects will be described with reference to a reference embodiment. FIG. 17A is a diagram illustrating an example of a diffraction phenomenon of reflected light in an imaging device 1000 of the reference embodiment, and FIG. 17B is an enlarged view of a main part of FIG. 17A. In the imaging device 1000, one color filter 1032 and one on-chip lens 1034 are provided for one pixel PX. For a pixel pitch P of the pixel PX, a pitch of the color filter 1032 is 2P and a pitch of the on-chip lens 1034 is P. In a case where the incident light LI enters the imaging device 1000 and light reflected on the color filter 1032 is diffracted, a plurality of reflected diffracted light beams DL2 satisfying 2P sin $\theta$=m$\lambda$ is generated. In FIGS. 17A and 17B, reflected diffracted light beams DL2 from the 0th order to the ±4th order are indicated by broken line arrows. Further, in a case where light reflected on the on-chip lens 1034 is diffracted, a plurality of reflected diffracted light beams DL1 satisfying P sin θ=mλ is generated. In FIGS. 17A and 17B, reflected diffracted light beams DL1 from the 0th order to the ±2nd order are indicated by solid arrows. The 0th-order, ±2nd-order, and ±4th-order reflected diffracted light beams DL2 out of the reflected diffracted light beams DL2 from the color filter 1032 and the 0th-order, ±1st-order, and ±2nd-order reflected diffracted light beams DL1 out of the reflected diffracted light beams DL1 from the on-chip lens 1034 overlap, resulting in particularly intense diffracted light. In FIG. 17A, for example, a refractive index of the on-chip lens 1034 is about 1.95 (silicon nitride), a refractive index of the embedded layer 1035 is 1.41 (fluorine-containing siloxane resin), and a refractive index of the transparent substrate 1037 is 1.5 (glass). A surface of the transparent substrate 1037 on an opposite side of a surface on which the embedded layer 1035 is provided is in contact with the air (having a refractive index of 1.0). With configurations of the members having the refractive indices described above, the diffracted light beams travel as illustrated in FIG. 17A. The 0th-order light is light traveling substantially perpendicular to an interface between the transparent substrate 1037 and the air, and no flare is generated from the 0th-order light. Further, diffracted light in which the ±1st-order reflected diffracted light beams DL1 and the ±2nd-order reflected diffracted light beams DL2 overlap is partially reflected on the interface between the transparent substrate 1037 and the air, but most of the diffracted light is transmitted to the air side and is not a large factor of the flare. Diffracted light in which the ±2nd-order reflected diffracted light beams DL1 and the ±4th-order reflected diffracted light beams DL2 overlap may be totally reflected on the interface between the transparent substrate 1037 and the air. For example, in a case where the transparent substrate 1037 is glass, the diffracted light in which the ±2nd-order reflected diffracted light beams DL1 and the ±4th-order reflected diffracted light beams DL2 overlap is totally reflected when an incident angle (p with respect to the interface between the transparent substrate 1037 and the air is larger than 41.8°. The diffracted light totally reflected on the interface between the transparent substrate 1037 and the air, for example, causes flare F by entering a pixel PX away from a pixel PX which the light originally supposed to enter.

In a case where the imaging device 1000 according to the reference embodiment illustrated in FIGS. 17A and 17B is a cavity-type imaging device in which a portion of the embedded layer 1035 is a space (a cavity), the catadioptric light may not totally reflect on the interface between the transparent substrate 1037 and the air in some cases. This is because the diffracted reflected light is largely refracted in a direction in which the incident light LI enters when the diffracted reflected light enters the transparent substrate 1037 (having a refractive index of 1.5) from the portion of the space (the cavity) (which is the air having a refractive index of 1.0), so that the incident angle φ with respect to the interface between the transparent substrate 1037 and the air does not exceed 41.8°. However, as illustrated in FIGS. 17A and 17B, in the cavity-less imaging device in which the embedded layer 1035 is provided in the portion of the space (the cavity) of the cavity-type imaging device, the catadioptric light may be totally reflected on the interface between the transparent substrate 1037 and the air as described above; therefore, the flare is more likely to occur than the cavity-type imaging device.

In the imaging device 1 according to the present embodiment, the wavelength region of the light to be received is the visible region (e.g., greater than or equal to 400 nm and less than or equal to 700 nm), and the on-chip lens 34 is provided in a pitch less than the length of the wavelength on the longest wavelength side (700 nm) of the wavelength region of the light to be received by the light reception section 10C, as described above. Accordingly, for light having a wavelength greater than the pitch of the on-chip lens 34 out of the visible region (e.g., greater than or equal to 400 nm and less than or equal to 700 nm) of the light to be received, it is possible to suppress the occurrence of the diffraction phenomenon when the light to be received that enters the imaging device 1 is reflected on the on-chip lens 34. The flare of the imaging device 1 is largely caused by diffracted light in which the reflected diffracted light from the color filter 32 and the reflected diffracted light from the on-chip lens 34 overlap each other; however, only the 0th-order light beams overlap with each other in the imaging device 1, and no flare is generated from the 0th-order light, so that it is possible to suppress generation of the flare in the imaging device 1.

As described above, the imaging device 1 according to the present embodiment is a cavity-less type which is able to achieve miniaturization of the device, and is also able to suppress the occurrence of the diffraction phenomenon when light is reflected on the on-chip lens 34, thereby suppressing the generation of the flare.

2. Modification Examples

Modification examples of the imaging device 1 according to the above-described embodiment will be described below. In the following modification examples, the same reference numerals are assigned to the same configurations as those in the above embodiment.

Modification Example A

In the method of manufacturing the imaging device described in the above embodiment, the patterned resin layer 34A is reflowed to form the on-chip lenses 34; however, the present disclosure is not limited thereto, and the patterned resin layer 34A may be formed by forming an on-chip lens base material layer 34B and transferring shapes of the on-chip lenses to the on-chip lens base material layer 34B.

A method of manufacturing an imaging device 1A as the modification example A will be described. FIGS. 18A to 22B illustrate an example of processes of manufacturing the imaging device 1A. Until the processes of forming the color filters 32 (the red filter 32R, the green filter 32G, and the blue filter 32B) illustrated in FIGS. 9A, 9B, and 9C are performed in a similar manner as the manufacturing method described in the above embodiment.

Next, as illustrated in FIGS. 18A and 18B, a light-transmissive material such as a metal-oxide-filler-containing resin is applied on the color filters 32 (the red filter 32R, the green filter 32G, and the blue filter 32B). Subsequently, a baking process is performed to form the on-chip lens base material layer 34B. Examples of the metal oxide filler include zinc oxide, zirconium oxide, niobium oxide, titanium oxide, and tin oxide. Alternatively, the on-chip lens base material layer 34B may include silicon nitride or silicon oxynitride.

Next, as illustrated in FIGS. 19A and 19B, for example, a material such as a thermoplastic positive photosensitive resin is applied and a pre-baking process is performed. Subsequently, in a pattern such that a pitch of an on-chip lens patterned portion 34D to be formed after a heat reflow process to be described later is less than the length of the wavelength on the longest wavelength side (700 nm) of the wavelength region of the light to be received by the light reception section 10C, an exposure process and a development process are performed to form a resin layer 34C.

Next, as illustrated in FIGS. 20A and 20B, the resin layer 34C is softened (reflowed) by being subjected to a baking process at a temperature higher than or equal to a thermal softening point temperature of the resin layer 34C (for example, higher than or equal to 120° C. and lower than or equal to 180° C.), and is formed into a lens shape, whereby the on-chip lens patterned portion 34D is formed.

Subsequently, as illustrated in FIGS. 21A and 21B, etching back is performed on the entire surface by an etching process such as dry etching, shapes of the on-chip lens patterned portions 34D are transferred to the on-chip lens base material layer 34B, and the on-chip lens base material layer 34B is processed into the on-chip lenses 34. With the etching back, the on-chip lens patterned portions 34D disappear. The dry etching may be performed using, for example, a microwave plasma-type etching apparatus, a parallel plate-type reactive ion etching (RIE: Reactive Ion Etching) apparatus, a high pressure narrow gap-type plasma etching apparatus, an ECR (Electron Cyclotron Resonance)-type etching apparatus, a transformer-coupled plasma-type etching apparatus, an inductively-coupled plasma-type etching apparatus, a helicon wave plasma-type etching apparatus, or another high-density plasma-type etching apparatus. Further, as etching gas used for the dry etching, $O_2$, $CF_4$, $Cl_2$, $N_2$, Ar, or the like may be appropriately adjusted and used. In a case where the on-chip lenses 34 have a gap therebetween, an inorganic material such as silicon nitride or silicon oxynitride may be formed to fill the gap (to make the gap smaller). Reducing the gap increases an effective area of the on-chip lenses 34 and enhances the sensitivity characteristic of the imaging device. Also in a case where the on-chip lens base material layer 34B includes silicon nitride or silicon oxynitride, the inorganic materials such as silicon nitride or silicon oxynitride may be formed to fill the gap if the on-chip lenses 34 have the gap therebetween.

Next, as illustrated in FIGS. 22A and 22B, a light-transmissive material having a refractive index lower than a refractive index of the on-chip lens 34, such as a hollow silica-containing resin is applied on the on-chip lenses 34, and a baking process is performed to form the embedded layer 35. Subsequently, an epoxy-based resin is applied on the embedded layer 35, and a baking process is performed at a temperature of higher than or equal to 80° C. and lower than or equal to 120° C. to form the adhesion layer 36. Next, the transparent substrate 37 such as a glass substrate is bonded to the adhesion layer 36, and a baking process is performed at a temperature of higher than or equal to 130° C. and lower than or equal to 200° C. to fix the transparent substrate. Except for the above, the manufacturing method is similar to the method of manufacturing the imaging device described in the embodiment. The imaging device 1A is manufactured in this manner.

In the imaging device 1A, in addition to the effects of the above-described embodiment, it is possible to form the on-chip lenses 34 using a material that is difficult to be processed into lens shapes by reflowing.

Modification Example B

In the above embodiment, the wavelength region of the light to be received by the light reception section 10C is the visible region (greater than or equal to 400 nm and less than or equal to 700 nm); however, the present disclosure is not limited thereto, and the light to be received by the light reception section may be in an ultraviolet region (less than or equal to 400 nm). An imaging device 1B as a modification example B has a configuration similar to that of the imaging device 1 of the embodiment, but differs in the wavelength region of the light to be received. Further, in response to the fact that the wavelength region of the light to be received is not the visible region, no color filter 32 is provided in the imaging device 1B, or a transparent layer is provided instead of the color filter 32.

FIG. 23 illustrates an example of a wavelength region of light to be received by the light reception section 10C of the imaging device 1B. A wavelength region RM2 of light to be received by the imaging device 1B is, for example, greater than or equal to 200 nm and less than or equal to 400 nm. Here, in a case where the pitch of the on-chip lens 34 of the imaging device 1B corresponds to a magnitude of a wavelength λ2, it is possible to suppress the occurrence of the diffraction phenomenon when light in a wavelength region R2 which is on the longer wavelength side than the wavelength λ2 is reflected on the on-chip lens 34. The wavelength λ2 is less than the wavelength on the longest wavelength side (400 nm) of the wavelength region of the light to be received, which makes it possible to suppress generation of reflected diffracted light for at least a portion of light (light of greater than or equal to λ2 and less than or equal to 400 nm) in the wavelength region RM2 (greater than or equal to 200 nm and less than or equal to 400 nm) of the light to be received. The wavelength λ2 is preferably less than the wavelength on the shortest wavelength side (200 nm) of the wavelength region of the light to be received. In this case, it is possible to suppress the generation of the reflected diffracted light in the entire region of the wavelength region RM2 (greater than or equal to 200 nm and less than or equal to 400 nm) of the light to be received. Thus, by suppressing the reflected diffracted light from the on-chip lens 34, it is possible to suppress the generation of the flare.

Modification Example C

In the above embodiment, the wavelength region of the light to be received by the light reception section 10C is the visible region (greater than or equal to 400 nm and less than or equal to 700 nm); however, the present disclosure is not limited thereto, and the light to be received by the light reception section may be in an infrared region (greater than or equal to 650 nm). An imaging device 1C as a modification example C has a configuration similar to that of the imaging device 1 of the embodiment, but differs in the wavelength region of the light to be received. Further, in response to the fact that the wavelength region of the light to be received is not the visible region, no color filter 32 is provided in the imaging device 1C, or a transparent layer is provided instead of the color filter 32.

FIG. 24 illustrates an example of a wavelength region of light to be received by the light reception section 10C of the imaging device 1C. A wavelength region RM3 of light to be received by the imaging device 1C is, for example, greater than or equal to 650 nm and less than or equal to 1200 nm. Here, in a case where the pitch of the on-chip lens 34 of the imaging device 1C corresponds to a magnitude of a wavelength λ3, it is possible to suppress the occurrence of the diffraction phenomenon when light in a wavelength region R3 which is on the longer wavelength side than the wavelength λ3 is reflected on the on-chip lens 34. The wavelength λ3 is less than the wavelength on the longest wavelength side (1200 nm) of the wavelength region of the light to be received, which makes it possible to suppress generation of reflected diffracted light for at least a portion of light (light of greater than or equal to λ3 and less than or equal to 1200 nm) in the wavelength region RM3 (greater than or equal to 650 nm and less than or equal to 1200 nm) of the light to be received. The wavelength λ3 is preferably less than the wavelength on the shortest wavelength side (650 nm) of the wavelength region of the light to be received. In this case, it is possible to suppress the generation of the reflected diffracted light in the entire region of the wavelength region RM3 (greater than or equal to 650 nm and less than or equal to 1200 nm) of the light to be received. Thus, by suppressing the reflected diffracted light from the on-chip lens 34, it is possible to suppress the generation of the flare.

Modification Example D

In the above embodiment, no optical filter is provided for suppressing transmission of light other than the light in the wavelength region of the light to be received by the light reception section 10C; however, the present disclosure is not limited thereto. An imaging device 1D as a modification example D differs from the above embodiment in that an optical filter that suppresses transmission of light other than the light in the wavelength region of the light to be received is provided.

FIG. 25 illustrates an example of a cross-sectional configuration of the imaging device 1D. A wavelength region of light to be received by the imaging device 1D is the visible region (greater than or equal to 400 nm and less than or equal to 700 nm). An optical filter 40 is disposed spaced apart from the transparent substrate 37 on the light incident side. The imaging device 1D is an example in which an optical filter is provided (an external optical filter is included) outside the imaging device. The optical filter 40 is, for example, an ultraviolet-cut filter (a filter that suppresses transmission of light of less than or equal to 400 nm), an infrared-cut filter (a filter that suppresses transmission of light of greater than or equal to 700 nm), or a combination thereof. The imaging device 1D has a configuration similar to that of the imaging device 1 of the embodiment except that the optical filter 40 is provided.

FIG. 26 illustrates the wavelength region of the light to be received by the light reception section 10C of the imaging device 1D and an example of an optical characteristic of the optical filter. The wavelength region RM1 of the light to be received by the imaging device 1D is greater than or equal to 400 nm and less than or equal to 700 nm, for example. The transmission characteristic of the optical filter 40 is indicated by a solid line SF1. The optical filter 40 is a filter (a visible-pass filter) that suppresses transmission of light of less than or equal to 400 nm and light of greater than or equal to 700 nm. For example, it is achievable by combining the ultraviolet-cut filter and the infrared-cut filter. Here, in a case where the pitch of the on-chip lens 34 of the imaging device 1D corresponds to the magnitude of the wavelength λ1, it is possible to suppress the occurrence of the diffraction phenomenon when light in the wavelength region R1 which is on the longer wavelength side than the wavelength λ1 is reflected on the on-chip lens 34. The wavelength λ1 is less than the wavelength on the longest wavelength side (700 nm) of the wavelength region of the light to be received, which makes it possible to suppress generation of reflected diffracted light for at least a portion of light (light of greater than or equal to λ1 and less than or equal to 700 nm) in the wavelength region RM1 (greater than or equal to 400 nm and less than or equal to 700 nm) of the light to be received. The wavelength λ1 is preferably less than the wavelength on the shortest wavelength side (400 nm) of the wavelength region of the light to be received. In this case, it is possible to suppress the generation of the reflected diffracted light in the entire region of the wavelength region RM1 (greater than or equal to 400 nm and less than or equal to 700 nm) of the light to be received. In addition, the imaging device 1D is provided with the optical filter 40 that suppresses transmission of light of less than or equal to 400 nm and light of greater than or equal to 700 nm. In particular, the suppression in the transmission of light of less than or equal to 400 nm causes the generation of the reflected diffracted light to be also suppressed for light in a wavelength region F1 of less than or equal to 400 nm. Thus, the suppression in the reflected diffracted light from the on-chip lens 34 makes it possible to suppress the generation of the flare.

Further, the wavelength region of the light to be received may be the ultraviolet region (less than or equal to 400 nm). FIG. 27 illustrates the wavelength region of the light to be received by the light reception section 10C of the imaging device 1D and another example of an optical characteristic of the optical filter. The wavelength region RM2 of the light to be received is 200 nm to 400 nm, for example. The transmission characteristic of the optical filter 40 is indicated by a solid line SF2. The optical filter 40 is a filter (an ultraviolet-pass filter) that suppresses transmission of light of less than or equal to 200 nm and light of greater than or equal to 400 nm and less than or equal to 700 nm. For example, it is achievable by combining a vacuum-ultraviolet-cut filter (that cuts light of less than or equal to 200 nm) and a visible-cut filter. Further, an infrared-cut filter may be combined. Here, in a case where the pitch of the on-chip lens 34 corresponds to the magnitude of the wavelength λ2, it is possible to suppress the occurrence of the diffraction phenomenon when light in the wavelength region R2 which is on the longer wavelength side than the wavelength λ2 is reflected on the on-chip lens 34. The wavelength λ2 is less than the wavelength on the longest wavelength side (400 nm) of the wavelength region of the light to be received, which makes it possible to suppress generation of reflected diffracted light for at least a portion of light (light of greater than or equal to λ2 and less than or equal to 400 nm) in the wavelength region RM2 (greater than or equal to 200 nm and less than or equal to 400 nm) of the light to be received. The wavelength λ2 is preferably less than the wavelength on the shortest wavelength side (200 nm) of the wavelength region of the light to be received. In this case, it is possible to suppress the generation of the reflected diffracted light in the entire region of the wavelength region RM2 (greater than or equal to 200 nm and less than or equal to 400 nm) of the light to be received. In addition, the optical filter 40 is provided that suppresses transmission of light of less than or equal to 200 nm and light of greater than or equal to 400 nm and less than or equal to 700 nm. In particular, the suppression in the transmission of light of less than or equal to 200 nm causes the generation of the reflected diffracted light to be also suppressed for light in a wavelength region F2 of less than or equal to 200 nm. Thus, the suppression in the reflected diffracted light from the on-chip lens 34 makes it possible to suppress the generation of the flare.

Further, wavelength region of the light to be received may be the infrared region (greater than or equal to 650 nm). FIG. 28 illustrates the wavelength region of the light to be received by the light reception section 10C of the imaging device 1D and another example of an optical characteristic of the optical filter. The wavelength region RM3 of the light to be received is greater than or equal to 650 nm and less than or equal to 1200 nm, for example. The transmission characteristic of the optical filter 40 is indicated by a solid line SF3. The optical filter 40 is a filter (an infrared-pass filter) that suppresses transmission of light of less than or equal to about 650 nm. For example, it is achievable by combining the ultraviolet-cut filter and the visible-cut filter. Here, in a case where the pitch of the on-chip lens 34 corresponds to the magnitude of the wavelength λ3, it is possible to suppress the occurrence of the diffraction phenomenon when light in the wavelength region R3 which is on the longer wavelength side than the wavelength λ3 is reflected on the on-chip lens 34. The wavelength λ3 is less than the wavelength on the longest wavelength side (1200 nm) of the wavelength region of the light to be received, which makes it possible to suppress generation of reflected diffracted light for at least a portion of light (light of greater than or equal to λ3 and less than or equal to 1200 nm) in the wavelength region RM3 (greater than or equal to 650 nm and less than or equal to 1200 nm) of the light to be received. The wavelength λ3 is preferably less than the wavelength on the shortest wavelength side (650 nm) of the wavelength region of the light to be received. In this case, it is possible to suppress the generation of the reflected diffracted light in the entire region of the wavelength region RM3 (greater than or equal to 650 nm and less than or equal to 1200 nm) of the light to be received. In addition, the optical filter 40 is provided that suppresses transmission of light of less than or equal to 650 nm. This causes the generation of the reflected diffracted light to be also suppressed for light in a wavelength region F3 of less than or equal to 650 nm. Thus, the suppression in the reflected diffracted light from the on-chip lens 34 makes it possible to suppress the generation of the flare.

Modification Example E

The imaging device 1D described above has a configuration in which the optical filter 40 is disposed (an external optical filter is included) spaced apart from the transparent substrate 37 on the light incident side; however, the present disclosure is not limited thereto. The imaging device 1D may have a configuration in which a built-in optical filter 41 in an imaging device 1E, between the on-chip lenses 34 and the transparent substrate 37.

FIG. 29 illustrates an example of a cross-sectional configuration of the imaging device 1E as a modification example E. The imaging device 1E includes the built-in optical filter 41, the adhesion layer 36, and the transparent substrate 37 in this order over the embedded layer 35. The built-in optical filter 41 may have a configuration similar to that of the optical filter 40 of the imaging device 1D, correspondingly to the wavelength region of the light to be received of the light reception section 10C. That is, for example, in a case where the wavelength region of the light to be received is the visible region (greater than or equal to 400 nm and less than or equal to 700 nm), the built-in optical filter 41 is a filter (a visible-pass filter) that suppresses transmission of light of less than or equal to 400 nm and light of greater than or equal to 700 nm. For example, it is achievable by combining the ultraviolet-cut filter and the infrared-cut filter. Alternatively, for example, in a case where the wavelength region of the light to be received is the ultraviolet region (less than or equal to 400 nm), the built-in optical filter 41 is a filter (an ultraviolet-pass filter) that suppresses transmission of light of less than or equal to 200 nm and light of greater than or equal to 400 nm and less than or equal to 700 nm. For example, it is achievable by combining the vacuum-ultraviolet-cut filter (that cuts light of less than or equal to 200 nm) and the visible-cut filter. Further, the infrared-cut filter may be combined. Alternatively, for example, in a case where the wavelength region of the light to be received is the infrared region (greater than or equal to 650 nm) the built-in optical filter 41 is a filter (an infrared-pass filter) that suppresses transmission of light of less than or equal to about 650 nm. For example, it is achievable by combining the ultraviolet-cut filter and the visible-cut filter.

In the imaging device 1E, the occurrence of the diffraction phenomenon at the time of reflection on the on-chip lens 34 is suppressed, and further, the built-in optical filter 41 that suppresses the transmission of light other than the light to be received is provided. This suppresses the generation of the flare.

3. Application Example

Application Example 1

The above-described imaging devices 1 and 1A to 1E (which are collectively referred to as imaging device 1) may be applied to, for example, various electronic apparatuses including a camera such as a digital still camera or a digital video camera, a mobile phone having an imaging function, and other devices each having an imaging function.

FIG. 30 is a block diagram illustrating an example of a schematic configuration of an electronic apparatus including the imaging device according to the embodiment and the modification examples described above.

An electronic apparatus 201 illustrated in FIG. 30 includes an optical system 202, a shutter device 203, an imaging device 1, a drive circuit 205, a signal processing circuit 206, a monitor 207, and a memory 208, and is able to capture a still image and a moving image.

The optical system 202 includes one or more lenses, directs light (incident light) from a subject to the imaging device 1, and forms an image on a light reception surface of the imaging device 1.

The shutter device 203 is disposed between the optical system 202 and the imaging device 1, and controls a light irradiation period and a light shielding period to the imaging device 1 in accordance with the control of the drive circuit 205.

The imaging device 1 includes a package including the imaging device described above. The imaging device 1 accumulates signal charge for a certain period of time in response to the light being imaged on the light reception surface via the optical system 202 and the shutter device 203. The signal charge accumulated in the imaging device 1 is transferred in accordance with a drive signal (a timing signal) supplied from the drive circuit 205.

The drive circuit 205 outputs the drive signal that controls a transferring operation of the imaging device 1 and a shutter operation of the shutter device 203, and drives the imaging device 1 and the shutter device 203.

The signal processing circuit 206 performs various types of signal processing on the signal charge outputted from the imaging device 1. An image (image data) obtained by the signal processing circuit 206 performing the signal processing is supplied to the monitor 207 and displayed, or supplied to the memory 208 and stored (recorded).

In the electronic apparatus 201 configured as described above, it is also possible to achieve the imaging with reduced flare by applying the imaging device 1 thereto.

Application Example 2

FIG. 31 illustrates an example of a schematic configuration of an imaging system 2 including the above-described imaging devices 1 and 1A to 1E. In FIG. 31, the imaging device 1 is illustrated as a representative of each of the imaging devices 1 and 1A to 1E. Hereinafter, the imaging devices 1 and 1A to 1E are collectively referred to as imaging device 1.

The imaging system 2 is, for example, an electronic apparatus which is an imaging device such as a digital still camera or a video camera, a portable terminal device such as a smartphone or a tablet-type terminal, or the like. The imaging system 2 includes, for example, the imaging device 1 according to the above-described embodiment and modification examples, a DSP circuit 141, a frame memory 142, a display 143, a storage 144, an operation unit 145, and a power source unit 146. In the imaging system 2, the imaging device 1 according to the above-described embodiment and modification examples, the DSP circuit 141, the frame memory 142, the display 143, the storage 144, the operation unit 145, and the power source unit 146 are coupled to each other via a bus line 147.

The imaging device 1 according to the above-described embodiment and modification examples outputs image data corresponding to incident light. The DSP circuit 141 is a signal processing circuit that processes a signal (image data) outputted from the imaging device 1 according to the above-described embodiment and modification examples 1 to W. The frame memory 142 temporarily retains the image data processed by the DSP circuit 141 in units of frames. The display 143 includes, for example, a panel-type display device such as a liquid crystal panel or an organic EL (Electro Luminescence) panel, and displays a moving image or a still image captured by the imaging device 1 according to the above-described embodiment and modification examples. The storage 144 records the image data of the moving image or the still image captured by the imaging device 1 according to the above-described embodiment and modification examples on a recording medium such as a semi-conductor memory or a hard disk. The operation unit 145 issues operation commands for various functions of the imaging system 2 in accordance with user's operations. The power source unit 146 appropriately supplies various power sources to be operation power sources of the imaging device 1 according to the above-described embodiment and modification examples, the DSP circuit 141, the frame memory 142, the display 143, the storage 144, and the operation unit 145 to these supplying targets.

Next, imaging procedures in the imaging system 2 will be described.

FIG. 32 illustrates an example of a flowchart of an imaging operation in the imaging system 2. A user issues a command to start imaging by operating the operation unit 145 (step S101). The operation unit 145 then transmits the imaging command to the imaging device 1 (step S102). Upon receiving the imaging command, the imaging device 1 (specifically, a system control circuit) performs imaging by a predetermined imaging method (step S103).

The imaging device 1 outputs image data obtained by the imaging to the DSP circuit 141. Here, the image data is data of all pixels of pixel signals generated on the basis of charge temporarily retained in a floating diffusion FD. The DSP circuit 141 performs predetermined signal processing (e.g., noise-reducing processing) on the basis of the image data inputted from the imaging device 1 (step S104). The DSP circuit 141 causes the frame memory 142 to retain the image data on which the predetermined signal processing has been performed, and the frame memory 142 causes the storage 144 to store the image data (step S105). In this manner, imaging in the imaging system 2 is performed.

In the present application example, the imaging device 1 according to the above-described embodiment and the modification examples A to E thereof is applied to the imaging system 2. As a result, it is possible to reduce the flare of the imaging device 1, which makes it possible to provide the imaging system 2 with reduced flare.

4. Practical Application Example

Practical Application Example 1

The technology according to the present disclosure (present technology) is applicable to a variety of products. For example, the technology according to the present disclosure may be achieved as a device mounted on any type of mobile body such as a vehicle, an electric vehicle, a hybrid electric vehicle, a motorcycle, a bicycle, a personal mobility, an airplane, a drone, a vessel, a robot, and the like.

FIG. 33 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 33, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 33, an audio speaker 12061, a display section 12062, and an instrument panel 12063 are illustrated as the output device. The display section 12062 may, for example, include at least one of an on-board display and a head-up display.

FIG. 34 is a diagram depicting an example of the installation position of the imaging section 12031.

In FIG. 34, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 34 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

In the forgoing, described is one example of the vehicle control system to which the technology according to the present disclosure is applicable. The technology according to the present disclosure is applicable to the imaging section 12031 among the above-described components. Specifically, the imaging device 1 according to the above-described embodiment and modification examples is applicable to the imaging section 12031. Applying the technology according to the present disclosure to the imaging section 12031 enables to obtain a high-definition captured image with reduced flare, and thereby making it possible to perform high-precision control using the captured image in the vehicle control system.

Practical Application Example 2

FIG. 35 is a view depicting an example of a schematic configuration of an endoscopic surgery system to which the technology according to an embodiment of the present disclosure (present technology) can be applied.

In FIG. 35, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 36 is a block diagram depicting an example of a functional configuration of the camera head 11102 and the CCU 11201 depicted in FIG. 35.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided correspondingly to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The above has described the example of the endoscopic surgery system to which the technology according to the present disclosure may be applied. The technology according to the present disclosure may be preferably applied to the image pickup unit 11402 included in the camera head 11102 of the endoscope 11100 among the above-described components. Applying the technology according to the present disclosure to the image pickup unit 11402 enables to reduce flare and make the image pickup unit 11402 to be miniaturized or high definition, and thereby making it possible to provide a miniaturized or high-definition endoscope 11100 with reduced flare.

Although the present disclosure has been described above with reference to: the embodiment, the modification examples A to E thereof, the application examples, and the practical application examples, the present disclosure is not limited to the above embodiment and the like, and may be modified in a variety of ways.

In the above-described embodiment and modification examples, the configurations of the imaging devices whose light to be received is in the visible region, the ultraviolet region, or the infrared region have been described; however, the present disclosure is not limited thereto. Instead of the above, the technology according to the present disclosure is also applicable to a configuration whose light to be received is in a wavelength region in which the visible region, the ultraviolet region, and the infrared region are combined, or a wavelength region other than the visible region, the ultraviolet region, and the infrared region.

It should be appreciated that the effects described herein are mere examples. Effects of the present disclosure are not limited to those described herein. The present disclosure may further include any effects other than those described herein.

It should be appreciated that the present technology may have the following configurations. According to the present technology having the following configurations, it is possible to reduce the flare.

(1)
An imaging device including:
a light reception section that includes a plurality of pixels each performing photoelectric conversion;
a plurality of on-chip lenses that is provided on a light incident side of the light reception section at a pitch less than a length of a wavelength on a longest wavelength side of a wavelength region of light to be received by the light reception section; and
a transparent substrate that is provided on a light incident side of the on-chip lenses.

(2)
The imaging device according to (1), in which the pitch is less than or equal to a length of a wavelength on a shortest wavelength side of the wavelength region.

(3)
The imaging device according to (1) or (2), in which a refractive index of the transparent substrate and a refractive index of the on-chip lenses are each higher than a refractive index of air, and a surface on a light incident side of the transparent substrate is in contact with the air.

(4)
The imaging device according to any one of (1) to (3), in which a space between the on-chip lenses and the transparent substrate is filled with an embedded layer.

(5)
The imaging device according to (4), in which a refractive index of the transparent substrate, a refractive index of the embedded layer, and a refractive index of the on-chip lenses are each higher than a refractive index of air.

(6)
The imaging device according to any one of (1) to (5), in which the pitch is less than or equal to a half of a pixel pitch of the pixels.

(7)
The imaging device according to any one of (1) to (6), in which the wavelength region is a visible region of greater than or equal to 400 nm and less than or equal to 700 nm.

(8)
The imaging device according to (7), further including color filters between the light reception section and the on-chip lenses.

(9)
The imaging device according to (8), in which the color filters are provided to the pixels on a one-to-one basis.

(10)
The imaging device according to (8), in which the color filters include at least one of a red filter, a green filter, a blue filter, a yellow filter, a magenta filter, a cyan filter, or a gray filter.

(11)

The imaging device according to (10), in which the color filters include a red filter, a green filter, and a blue filter.

(12)

The imaging device according to any one of (1) to (6), in which the wavelength region is an ultraviolet region of less than or equal to 400 nm.

(13)

The imaging device according to any one of (1) to (6), in which the wavelength region is an infrared region of greater than or equal to 650 nm.

(14)

The imaging device according to any one of (1) to (13), further including an optical filter that absorbs or reflects at least a portion of light having a wavelength which is excluded from the wavelength region.

(15)

The imaging device according to (14), in which the optical filter is provided between the on-chip lenses and the light reception section.

(16)

The imaging device according to (14), in which the optical filter is disposed spaced apart from the transparent substrate.

(17)

The imaging device according to (14), in which
the wavelength region is a visible region of greater than or equal to 400 nm and less than or equal to 700 nm, and
the optical filter absorbs or reflects at least a portion of light of less than or equal to 400 nm and light of greater than or equal to 700 nm.

(18)

The imaging device according to (14), in which
the wavelength region is an ultraviolet region of less than or equal to 400 nm, and
the optical filter absorbs or reflects at least a portion of light of less than or equal to a wavelength on a shortest wavelength side of the wavelength region.

(19)

The imaging device according to (14), in which
the wavelength region is an infrared region of greater than or equal to 650 nm, and
the optical filter absorbs or reflects at least a portion of light of less than or equal to 650 nm.

(20)

An electronic apparatus including:
an optical system;
an imaging device; and
a signal processing circuit, in which
the imaging device includes
a light reception section that includes a plurality of pixels each performing photoelectric conversion,
a plurality of on-chip lenses that is provided on a light incident side of the light reception section at a pitch less than a length of a wavelength on a longest wavelength side of a wavelength region of light to be received by the light reception section, and
a transparent substrate that is provided on a light incident side of the on-chip lenses.

This application claims the benefit of Japanese Priority Patent Application JP2019-006276 filed with the Japan Patent Office on Jan. 17, 2019, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. An imaging device, comprising:
a light reception section that includes a plurality of pixels, wherein each pixel of the plurality of pixels is configured to:
receive first light in a wavelength region; and
perform photoelectric conversion based on the reception of the first light;
a plurality of on-chip lenses on a light incident side of the light reception section,
wherein the plurality of on-chip lenses is at a pitch less than a length of a first wavelength on a longest wavelength side of the wavelength region;
a transparent substrate on a light incident side of the plurality of on-chip lenses; and
an embedded layer between the transparent substrate and the plurality of on-chip lenses, wherein
the embedded layer seals surfaces of the plurality of on-chip lenses, and
the embedded layer includes a light-transmissive material having a refractive index lower than a refractive index of each on-chip lens of the plurality of on-chip lenses.

2. The imaging device according to claim 1, wherein the pitch is less than or equal to a length of a second wavelength on a shortest wavelength side of the wavelength region.

3. The imaging device according to claim 1, wherein
a refractive index of the transparent substrate is higher than a refractive index of air,
the refractive index of each on-chip lens of the plurality of on-chip lenses is higher than the refractive index of the air,
the transparent substrate includes a surface on a light incident side of the transparent substrate, and
the surface is in contact with the air.

4. The imaging device according to claim 1, wherein
a refractive index of the transparent substrate is higher than a refractive index of air,
the refractive index of the embedded layer is higher than the refractive index of the air, and
the refractive index of each on-chip lens of the plurality of on-chip lenses is higher than the refractive index of the air.

5. The imaging device according to claim 1, wherein the pitch is less than or equal to a half of a pixel pitch of the plurality of pixels.

6. The imaging device according to claim 1, wherein the wavelength region is a visible region of greater than or equal to 400 nm and less than or equal to 700 nm.

7. The imaging device according to claim 6, further comprising a plurality of color filters between the light reception section and the plurality of on-chip lenses.

8. The imaging device according to claim 7, wherein each color filter of the plurality of color filters corresponds to a respective pixel of the plurality of pixels.

9. The imaging device according to claim 7, wherein the plurality of color filters includes at least one of a red filter, a green filter, a blue filter, a yellow filter, a magenta filter, a cyan filter, or a gray filter.

10. The imaging device according to claim 9, wherein the plurality of color filters further includes the red filter, the green filter, and the blue filter.

11. The imaging device according to claim 1, wherein the wavelength region is an ultraviolet region of less than or equal to 400 nm.

12. The imaging device according to claim 1, wherein the wavelength region is an infrared region of greater than or equal to 650 nm.

13. The imaging device according to claim 1, further comprising an optical filter configured to one of absorb or reflect at least one portion of second light,
  wherein the at least one portion of the second light has a second wavelength which is excluded from the wavelength region.

14. The imaging device according to claim 13, wherein the optical filter is between the light reception section and the plurality of on-chip lenses.

15. The imaging device according to claim 13, wherein the optical filter is spaced apart from the transparent substrate.

16. The imaging device according to claim 13, wherein
  the wavelength region is a visible region of greater than or equal to 400 nm and less than or equal to 700 nm, and
  the optical filter is further configured to one of absorb or reflect the at least one portion of the second light of less than or equal to 400 nm and greater than or equal to 700 nm.

17. The imaging device according to claim 13, wherein the wavelength region is an ultraviolet region of less than or equal to 400 nm, and
  the optical filter is further configured to one of absorb or reflect the at least one portion of the second light of less than or equal to a third wavelength on a shortest wavelength side of the wavelength region.

18. The imaging device according to claim 13, wherein the wavelength region is an infrared region of greater than or equal to 650 nm, and
  the optical filter is further configured to one of absorb or reflect the at least one portion of the second light of less than or equal to 650 nm.

19. An electronic apparatus, comprising:
  an imaging device that includes:
    a light reception section that includes a plurality of pixels, wherein each pixel of the plurality of pixels is configured to:
      receive light in a wavelength region; and
      perform photoelectric conversion based on the reception of the light;
    a plurality of on-chip lenses on a light incident side of the light reception section,
      wherein the plurality of on-chip lenses is at a pitch less than a length of a wavelength on a longest wavelength side of the wavelength region; and
    a transparent substrate on a light incident side of the plurality of on-chip lenses; and
    an embedded layer between the transparent substrate and the plurality of on-chip lenses, wherein
      the embedded layer seals surfaces of the plurality of on-chip lenses,
      the embedded layer includes a light-transmissive material having a refractive index lower than a refractive index of each on-chip lens of the plurality of on-chip lenses, and
      the imaging device is configured to accumulate a signal charge based on the light;
  an optical system configured to direct the light to the imaging device; and
  a signal processing circuit configured to execute a signal process on the signal charge.

* * * * *